US012660463B2

(12) United States Patent
Han et al.

(10) Patent No.: US 12,660,463 B2
(45) Date of Patent: Jun. 16, 2026

(54) DISPLAY SUBSTRATE AND DISPLAY APPARATUS

(71) Applicant: BOE Technology Group Co., Ltd., Beijing (CN)

(72) Inventors: Cheng Han, Beijing (CN); Qixiao Wu, Beijing (CN); Zhihui Zhang, Beijing (CN); Yanqiang Wang, Beijing (CN); Songquan Wu, Beijing (CN); Yanming Wang, Beijing (CN); Xu Li, Beijing (CN); Le Wang, Beijing (CN); Lihui Luo, Beijing (CN); Yansong Li, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 394 days.

(21) Appl. No.: 18/264,066

(22) PCT Filed: Nov. 24, 2022

(86) PCT No.: PCT/CN2022/134113
§ 371 (c)(1),
(2) Date: Aug. 2, 2023

(87) PCT Pub. No.: WO2024/108498
PCT Pub. Date: May 30, 2024

(65) Prior Publication Data
US 2025/0008805 A1 Jan. 2, 2025

(51) Int. Cl.
*H10K 59/38* (2023.01)
*H10K 59/40* (2023.01)
(Continued)

(52) U.S. Cl.
CPC ........... *H10K 59/38* (2023.02); *H10K 59/873* (2023.02); *H10K 59/877* (2023.02);
(Continued)

(58) Field of Classification Search
CPC ...... H10K 59/38; H10K 59/879; H10K 59/40; H10K 59/877; H10K 59/873; H10K 2102/311
See application file for complete search history.

(56) References Cited

U.S. PATENT DOCUMENTS

2004/0253413 A1 12/2004 Baba et al.
2014/0346469 A1 11/2014 Shin et al.
(Continued)

FOREIGN PATENT DOCUMENTS

CN 103474582 A 12/2013
CN 110112318 A 8/2019
(Continued)

OTHER PUBLICATIONS

International Search Report & Written Opinion mailed Jun. 19, 2023, regarding PCT/CN2022/134113.

*Primary Examiner* — Mary Ellen Bowman
(74) *Attorney, Agent, or Firm* — Intellectual Valley Law, P.C.

(57) ABSTRACT

A display substrate includes a light emitting element on a base substrate; and a light modulating structure on a side of the light emitting element away from the base substrate. The light modulating structure includes a color filter layer and a substantially transparent layer on a side of the color filter layer away from the base substrate. The color filter layer includes a plurality of color filter units, a respective color filter unit of the plurality of color filter units being in an individual subpixel. Adjacent color filter units are spaced apart by a portion of the substantially transparent layer that extends into a region between the adjacent color filter units. An orthographic projection of the respective color filter unit on the base substrate at least partially overlaps with an (Continued)

orthographic projection of a light emitting layer of the light emitting element on the base substrate.

18 Claims, 33 Drawing Sheets

(51) Int. Cl.
    *H10K 59/80*           (2023.01)
    *H10K 102/00*       (2023.01)

(52) U.S. Cl.
    CPC ........... *H10K 59/879* (2023.02); *H10K 59/40* (2023.02); *H10K 2102/311* (2023.02)

(56)            References Cited

U.S. PATENT DOCUMENTS

| | | |
|---|---|---|
| 2015/0048333 A1 | 2/2015 | Choi et al. |
| 2016/0020259 A1 | 1/2016 | Cheng et al. |
| 2019/0018287 A1* | 1/2019 | Lüchinger ............ C09K 11/665 |
| 2020/0161579 A1* | 5/2020 | Kim ..................... H10K 59/126 |
| 2020/0403038 A1 | 12/2020 | Kim et al. |
| 2021/0181589 A1* | 6/2021 | Zhang ................ G06V 40/1318 |
| 2021/0305329 A1 | 9/2021 | Ma et al. |
| 2022/0149334 A1 | 5/2022 | Liu et al. |
| 2022/0328794 A1* | 10/2022 | Huang ................... H10K 59/38 |
| 2023/0116030 A1 | 4/2023 | Sui et al. |
| 2023/0157138 A1* | 5/2023 | Gong ..................... H10K 59/38 |
| | | 257/91 |

FOREIGN PATENT DOCUMENTS

| | | |
|---|---|---|
| CN | 110928032 A | 3/2020 |
| CN | 111108602 A | 5/2020 |
| CN | 112366221 A | 2/2021 |
| CN | 113113454 A | 7/2021 |
| CN | 113241354 A | 8/2021 |
| CN | 114582924 A | 6/2022 |
| JP | 2004347930 A | 12/2004 |
| KR | 20120127897 A | 11/2012 |
| KR | 20120134222 A | 12/2012 |
| KR | 20210081945 A | 7/2021 |
| WO | 2022065544 A1 | 3/2022 |

\* cited by examiner

C

PL mw1

CFL — CFU    STL

OC

TE2 — TS

TE1 — T1

BUF — CVD2

HRL — HRB    IJP    EN mw2    CVD1

PDL    CD    LE

EL

AD

PLN2    RE

PLN1    TFT

PVX    D    S

ILD    Ce2

IN    Ce1    G

GI    ACT

BS

SR3    ISR    SR2    ISR    SR1

CFU

LE

TFT

C

PL

STL

OC

TE2

TE1 — T1

BUF

CVD2

TS

CFL — mw1

CFU

HRL — HRB

IJP — EN mw2

CVD1

PS

CD

PDL

EL

LE

AD

PLN2 — RE

PLN1 — TFT

PVX — D   S

ILD — Ce2

IN — Ce1 — G

GI — ACT

BS

S2"

S3" — HRB — S4"

IJP

CVD1

θ1"   S1"   θ2"

DISPLAY SUBSTRATE AND DISPLAY APPARATUS

CROSS-REFERENCE TO RELATED APPLICATION

This application is a national stage application under 35 U.S.C. § 371 of International Application No. PCT/CN2022/134113, filed Nov. 24, 2022, the contents of which are incorporated by reference in the entirety.

TECHNICAL FIELD

The present invention relates to display technology, more particularly, to a display substrate and a display apparatus.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatus. An OLED display apparatus typically includes an anode, an organic layer including a light emitting layer, and a cathode. OLEDs can be either a bottom-emission type OLED or a top-emission type OLED.

SUMMARY

In one aspect, the present disclosure provides a display substrate, comprising: a base substrate; a light emitting element on the base substrate; and a light modulating structure on a side of the light emitting element away from the base substrate; wherein the light modulating structure comprises a color filter layer and a substantially transparent layer on a side of the color filter layer away from the base substrate; the color filter layer comprises a plurality of color filter units, a respective color filter unit of the plurality of color filter units being in an individual subpixel; adjacent color filter units of the plurality of color filter units are spaced apart by a portion of the substantially transparent layer that extends into a region between the adjacent color filter units; and an orthographic projection of the respective color filter unit on the base substrate at least partially overlaps with an orthographic projection of a light emitting layer of the light emitting element on the base substrate.

Optionally, the respective color filter unit is configured to filter light emitted from the light emitting layer; a first portion of light transmits through the respective color filter unit and out of the display substrate; a second portion of light emitted from the light emitting layer transmits out of the display substrate without transmitting through the respective color filter unit; the first portion and the second portion in combination display a subpixel image; the first portion transmits out of the display substrate in a first range of viewing angles; the second portion transmits out of the display substrate in a second range of viewing angles; and the second range of viewing angles is greater than the first range of viewing angles.

Optionally, at least 50% and no more than 95% of light emitted from the light emitting layer transmits through the respective color filter unit, forming the first portion; and at least 5% and no more than 50% of light emitted from the light emitting layer transmits out of the display substrate without transmitting through the respective color filter unit, forming the second portion.

Optionally, in a cross-section along a plane perpendicular to the base substrate and intersecting a plurality of subpixels, the respective color filter unit has a first maximum width; a subpixel aperture of the individual subpixel has an aperture width; and the first maximum width and the aperture width are substantially the same.

Optionally, the respective color filter unit comprises a plurality of color filter blocks spaced apart from each other by a substantially transparent material or by a fill layer comprising light scattering particles dispersed in a matrix.

Optionally, the light modulating structure further comprises a high refractive layer; the high refractive layer comprises a plurality of high refractive blocks; and a respective high refractive block of the plurality of high refractive blocks is in the individual subpixel.

Optionally, the display substrate further comprises an encapsulating layer comprising a first inorganic encapsulating sub-layer and an organic encapsulating sub-layer on a side of the first inorganic encapsulating sub-layer away from the base substrate; wherein the respective high refractive block is on a side of the first inorganic encapsulating sub-layer away from the base substrate, and on a side of the organic encapsulating sub-layer closer to the base substrate; the respective high refractive block is in direct contact with the first inorganic encapsulating sub-layer, and in direct contact with the organic encapsulating sub-layer; and an orthographic projection of the respective high refractive block on the base substrate at least partially overlaps with the orthographic projection of the light emitting layer on the base substrate.

Optionally, a refractive index of the high refractive layer is greater than a refractive index of the first inorganic encapsulating sub-layer, and is greater than a refractive index of the organic encapsulating sub-layer; and the refractive index of the first inorganic encapsulating sub-layer is greater than the refractive index of the organic encapsulating sub-layer.

Optionally, the color filter layer is on a side of the high refractive layer away from the first inorganic encapsulating sub-layer, and is on a side of the organic encapsulating sub-layer closer to the first inorganic encapsulating sub-layer; and the respective color filter unit is in direct contact with the respective high refractive block, and is in direct contact with the organic encapsulating sub-layer.

Optionally, the light modulating structure further comprises a lens layer; the lens layer comprises a plurality of lenses; the orthographic projection of the respective color filter unit on the base substrate at least partially overlaps with an orthographic projection of the plurality of lenses on the base substrate; and the plurality of lenses have a refractive index less than a refractive index of the color filter layer.

Optionally, the display substrate further comprises a color conversion layer comprising a plurality of color conversion blocks, the color conversion layer comprising a plurality of quantum dots; wherein the display substrate includes a plurality of subpixel regions, including a first subpixel region, a second subpixel region, and a third subpixel region; and the plurality of color conversion blocks and the color filter layer are absent in the first subpixel region, and are present in at least one of the second subpixel region or the third subpixel region.

Optionally, the display substrate further comprises a first refractive layer and a second refractive layer, the second refractive layer being on a side of the first refractive layer away from the base substrate; wherein the second refractive layer has a refractive index higher than a refractive index of the first refractive layer; and the orthographic projection of the respective color filter unit on the base substrate is at least partially non-overlapping with an orthographic projection of the first refractive layer on the base substrate.

Optionally, the display substrate further comprises: a black matrix in an inter-subpixel region; a second color filter layer at least partially in a subpixel region; and a planarization layer on a side of the black matrix and the second color filter layer away from the base substrate; wherein the second color filter layer comprises a plurality of second color filter blocks spaced apart by the black matrix; the color filter layer is on a side of the planarization layer away from the base substrate; and the orthographic projection of the respective color filter unit on the base substrate at least partially overlaps with an orthographic projection of a respective second color filter block of the plurality of second color filter blocks on the base substrate.

Optionally, in a cross-section along a plane perpendicular to the base substrate and intersecting a plurality of subpixels, the respective color filter unit has a first side, a second side opposite to the first side, a third side connecting the first side and the second side, and a fourth side connecting the first side and the second side, the fourth side being opposite to the third side; the first side has a first width; the second side has a second width; and the second width is greater than the first width.

Optionally, a first included angle between the third side and the first side is in a range of 100 degrees to 140 degrees; and a second included angle between the fourth side and the first side is in a range of 100 degrees to 140 degrees.

Optionally, the display substrate comprises one or more first regions and a second region; wherein the one or more first regions is a bendable region or a bent region; the second region is an unbent region; and the light modulating structure is at least partially present in the one or more first region, and is at least partially absent in the second region.

Optionally, the display substrate comprises a plurality of subpixel regions, including a first subpixel region, a second subpixel region, and a third subpixel region; and the color filter layer is present in the first subpixel region, and is absent in at least one of the second subpixel region or the third subpixel region.

Optionally, the display substrate comprises a plurality of subpixel regions, including a first subpixel region, a second subpixel region, and a third subpixel region; and the color filter layer is absent in the first subpixel region, and is present in at least one of the second subpixel region or the third subpixel region.

Optionally, the display substrate comprises a plurality of subpixel regions, including a first subpixel region, a second subpixel region, and a third subpixel region; and the color filter layer is present in all of the first subpixel region, the second subpixel region, and the third subpixel region.

In another aspect, the present disclosure provides a display apparatus, comprising the display substrate described herein or fabricated by a method described herein, and one or more integrated circuits connected to the display substrate.

BRIEF DESCRIPTION OF THE FIGURES

The following drawings are merely examples for illustrative purposes according to various disclosed embodiments and are not intended to limit the scope of the present invention.

4

Figure 1:
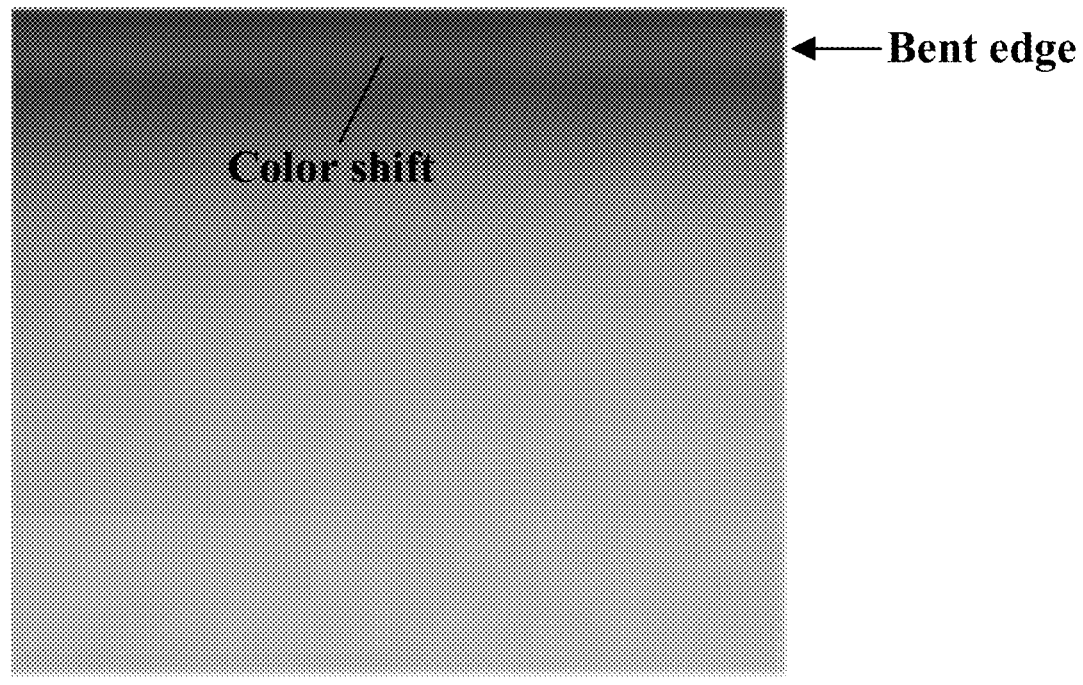

FIG. 1 illustrates color shift in a bent edge of a related display panel.

Figure 2:
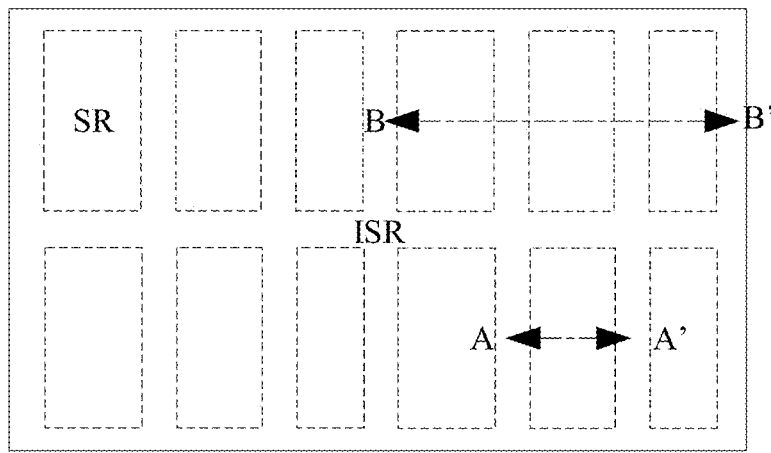

FIG. 2 is a schematic diagram illustrating the structure of a display substrate in some embodiments according to the present disclosure.

Figure 3:
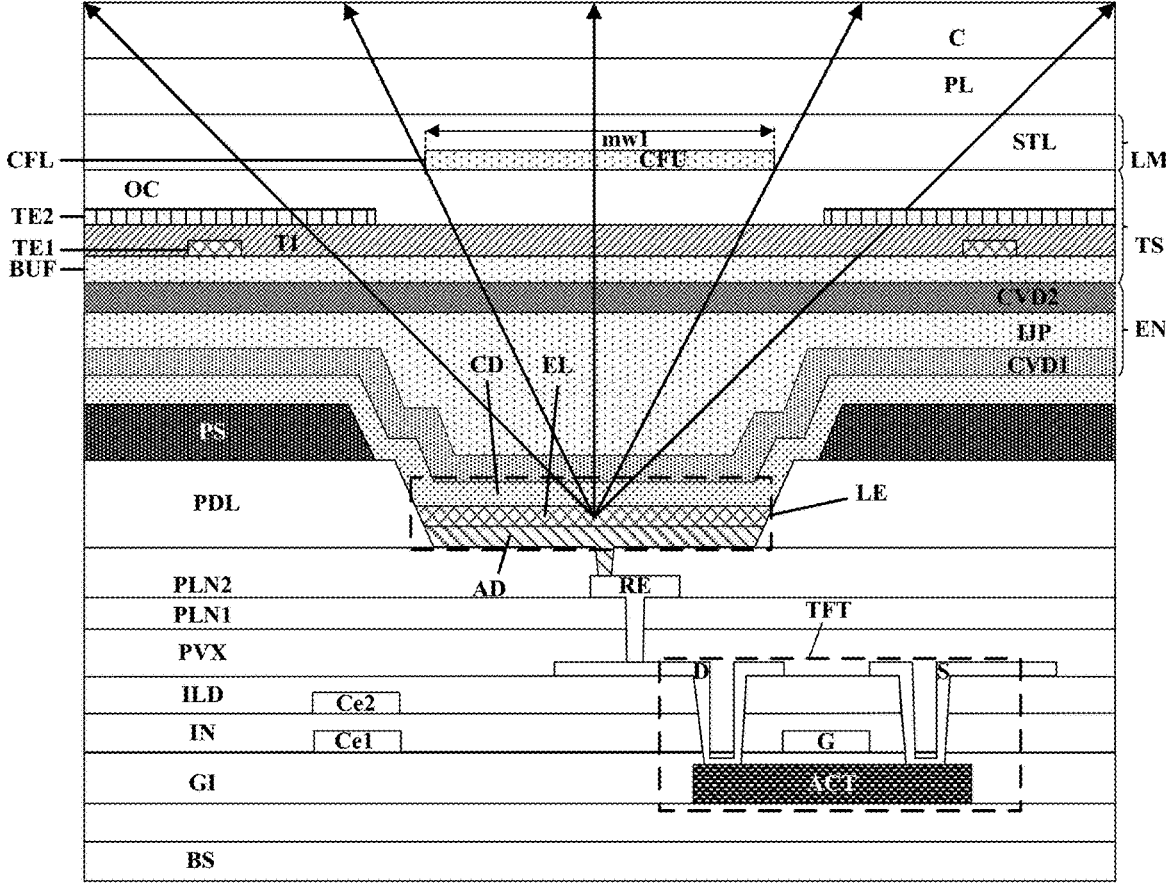

FIG. 3 is a cross-sectional view along an A-A' line in FIG. 2.

Figure 4:
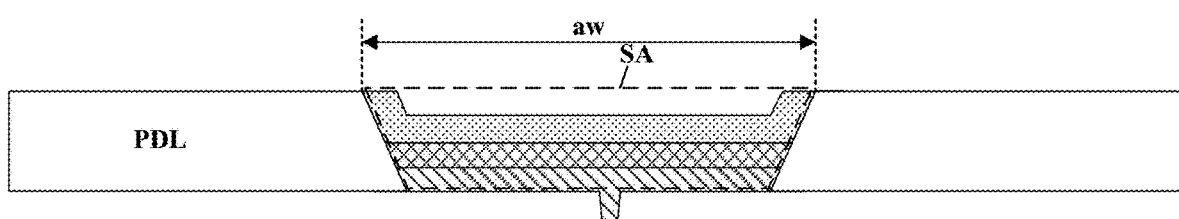

FIG. 4 illustrates a subpixel aperture in a respective subpixel in a display substrate in some embodiments according to the present disclosure.

Figure 5:
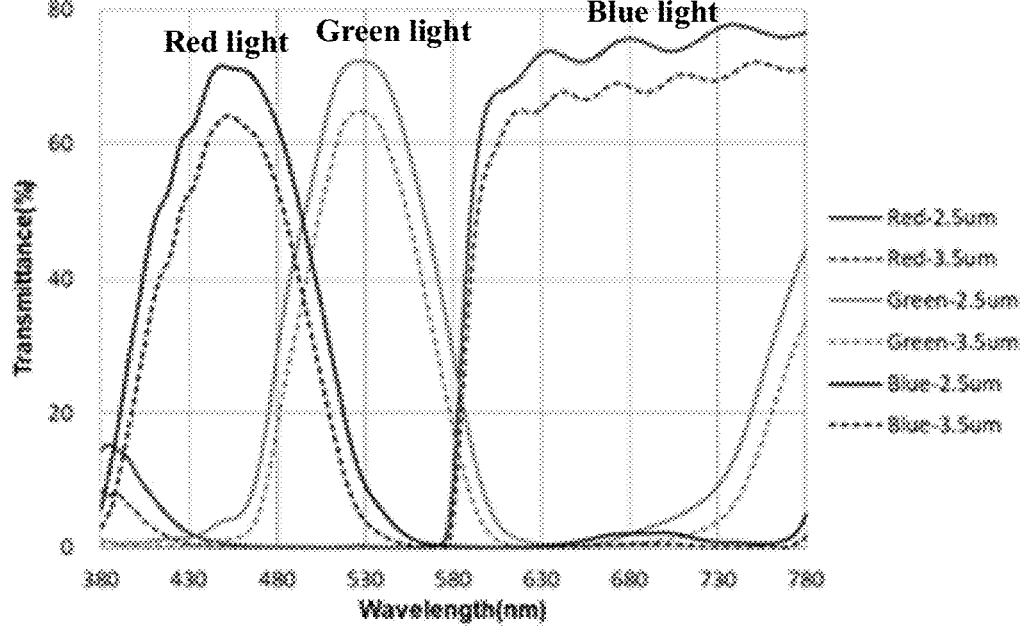

FIG. 5 shows light transmittance rate through a respective color filter unit in some embodiments according to the present disclosure.

Figure 6:
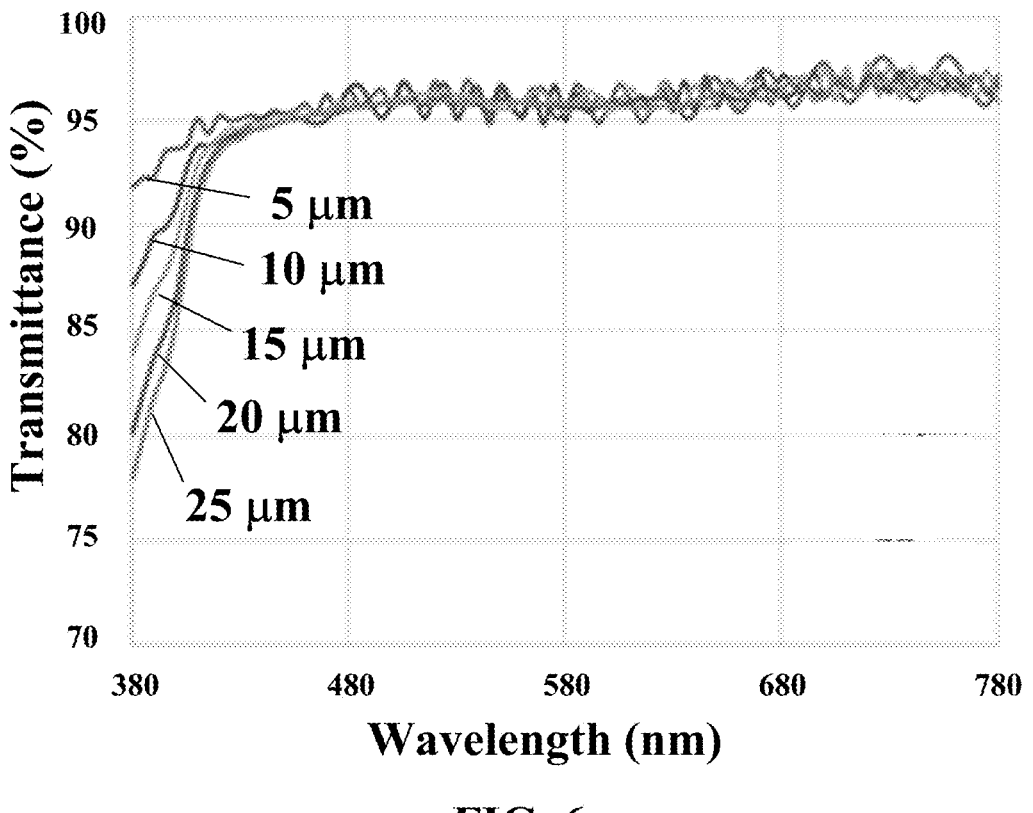

FIG. 6 shows light transmittance rate through a substantially transparent layer in some embodiments according to the present disclosure.

Figure 7:
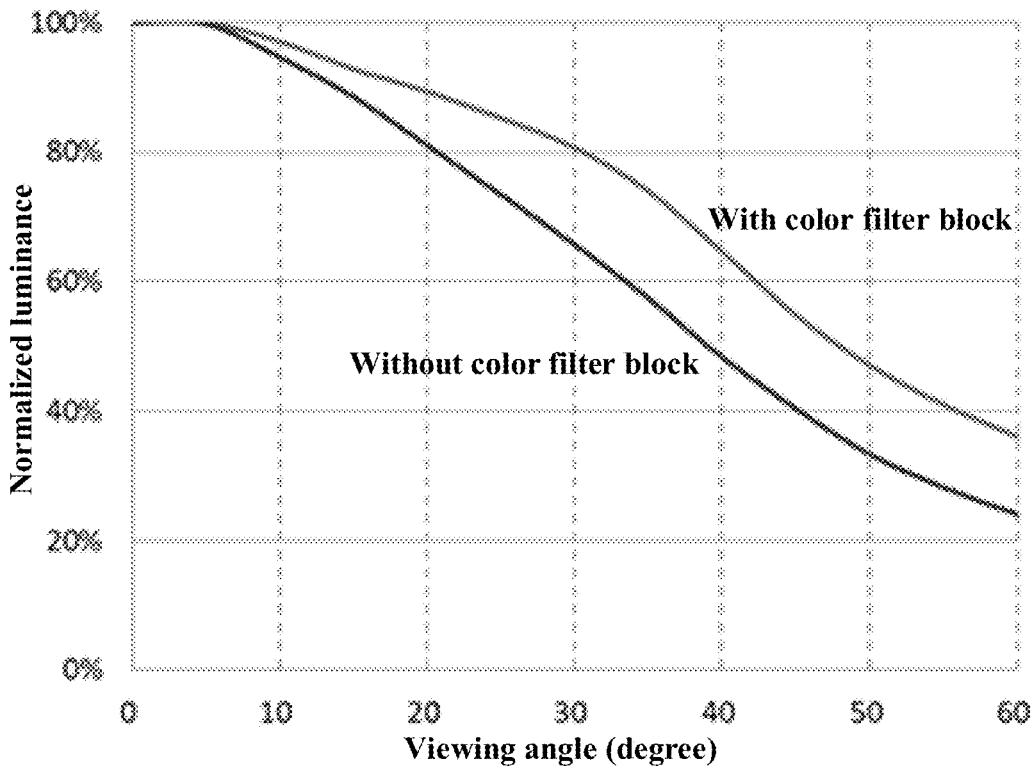

FIG. 7 shows blue light luminance decay with or without a respective color filter unit in some embodiments according to the present disclosure.

Figure 8:
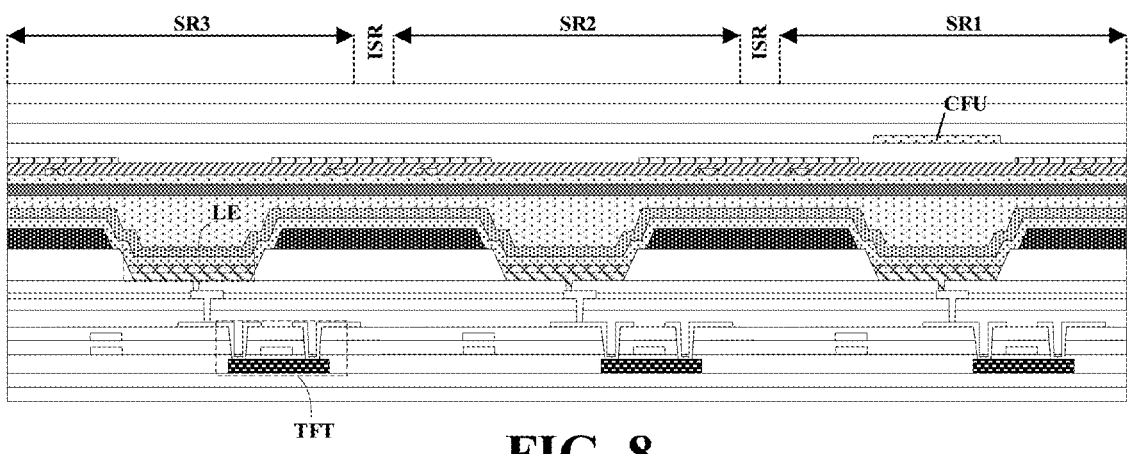

FIG. 8 is a cross-sectional view along a B-B' line in FIG. 2.

Figure 9:
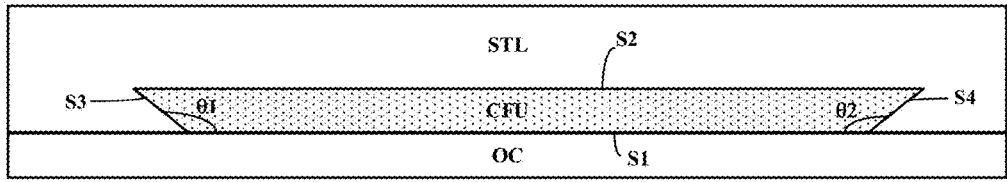

FIG. 9 is a schematic diagram illustrating the structure of a light modulating structure in some embodiments according to the present disclosure.

Figure 10:
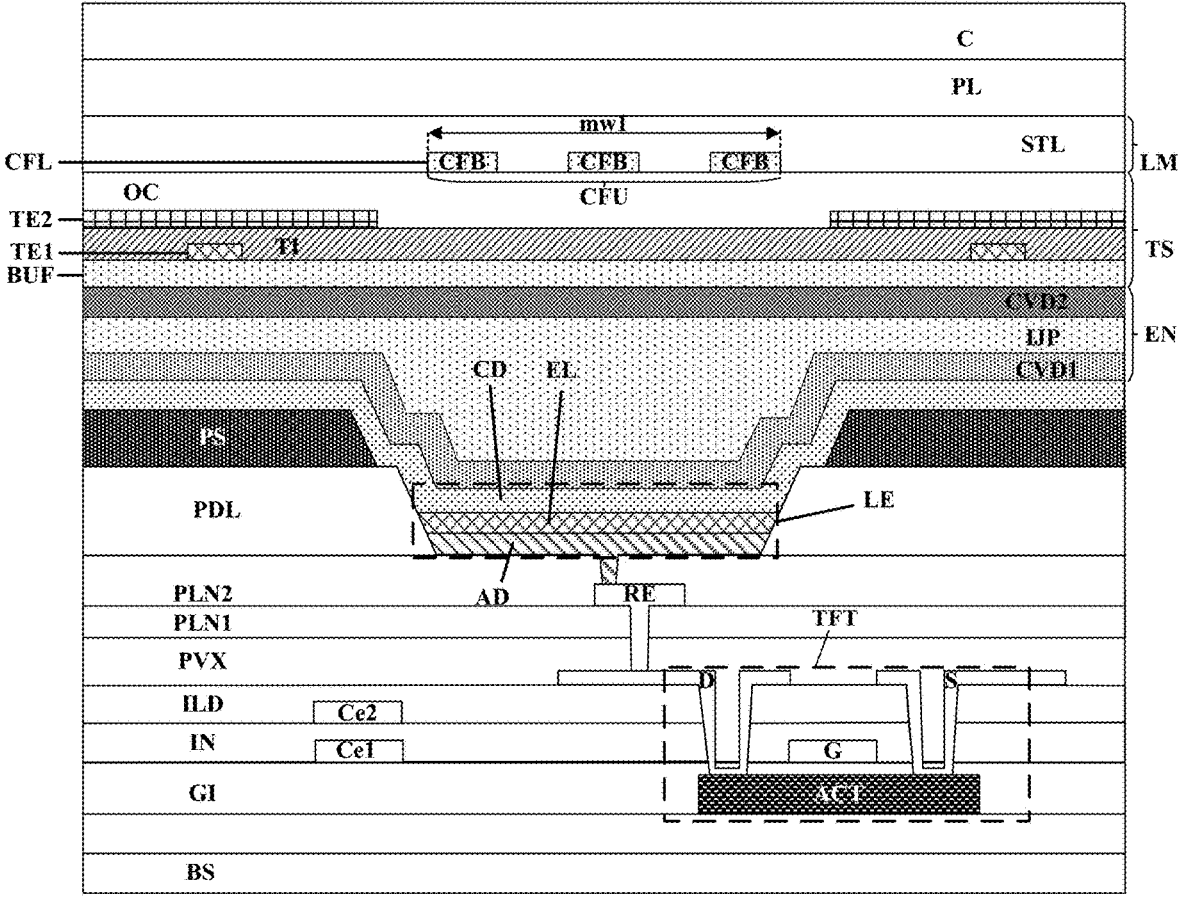

FIG. 10 is a cross-sectional view of a display substrate in some embodiments according to the present disclosure.

Figure 11:
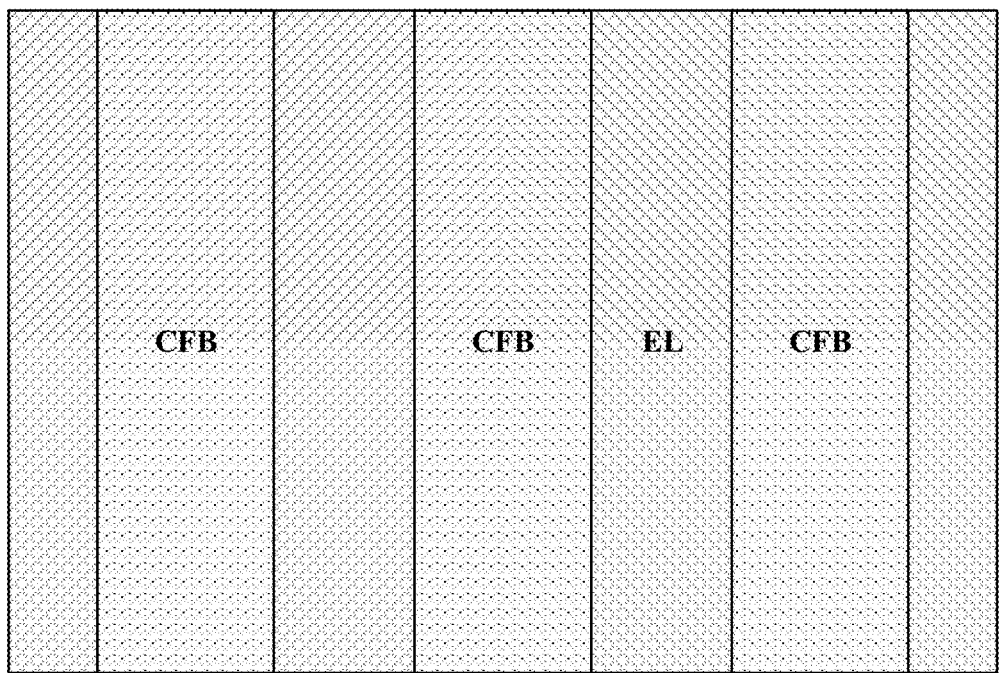

FIG. 11 is a superimposed view of a respective color filter unit and a light emitting layer in some embodiments according to the present disclosure.

Figure 12:
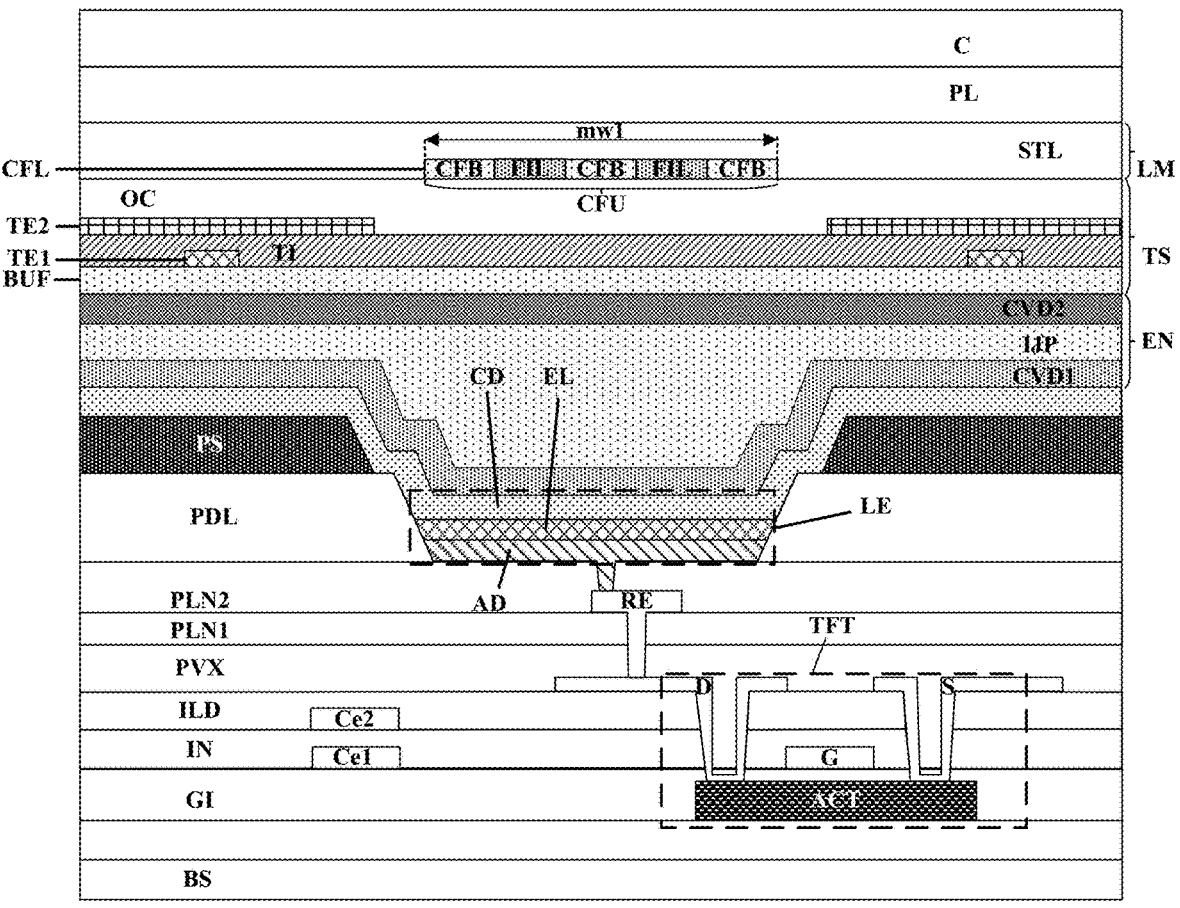

FIG. 12 is a cross-sectional view of a display substrate in some embodiments according to the present disclosure.

Figure 13:
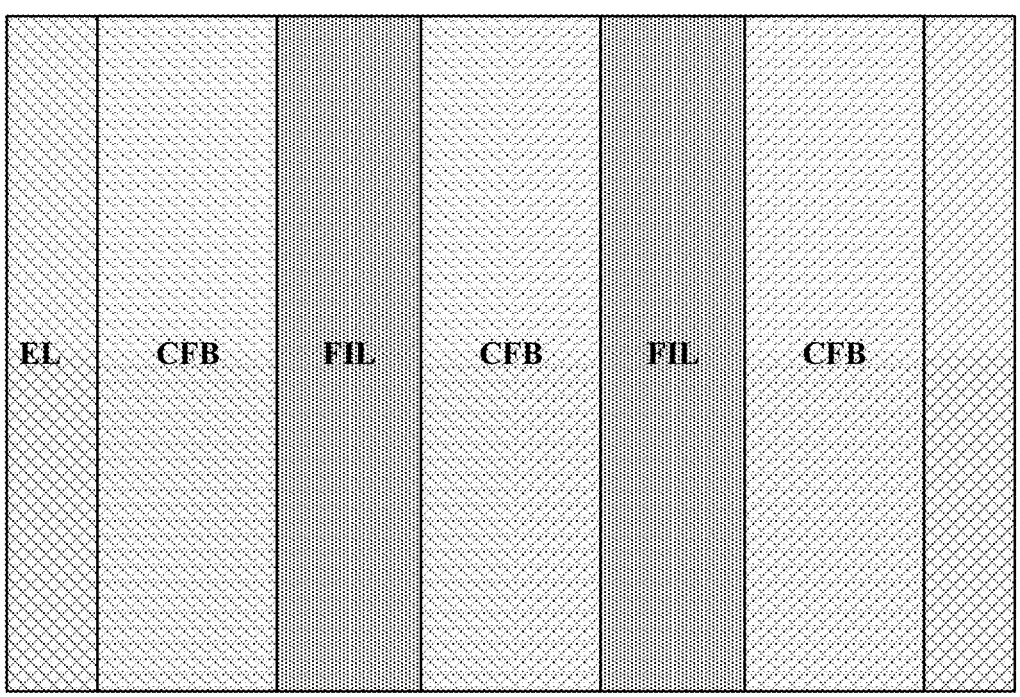

FIG. 13 is a superimposed view of a respective color filter unit and a light emitting layer in some embodiments according to the present disclosure.

Figure 14:
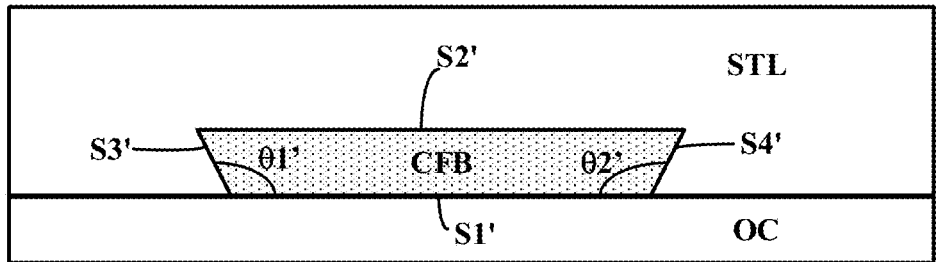

FIG. 14 is a schematic diagram illustrating the structure of a respective color filter block in some embodiments according to the present disclosure.

Figure 15A:
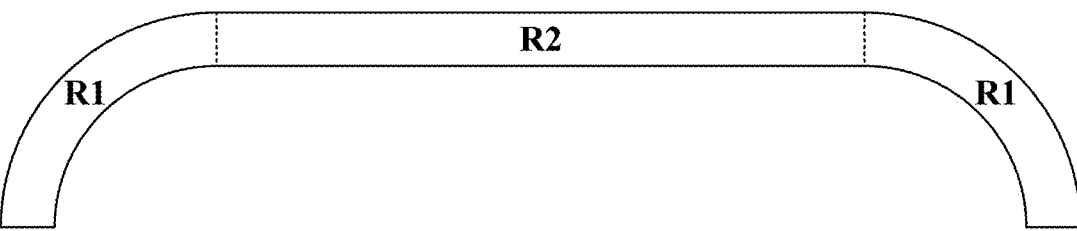

FIG. 15A is a cross-sectional view of a display substrate in some embodiments according to the present disclosure.

Figure 15B:
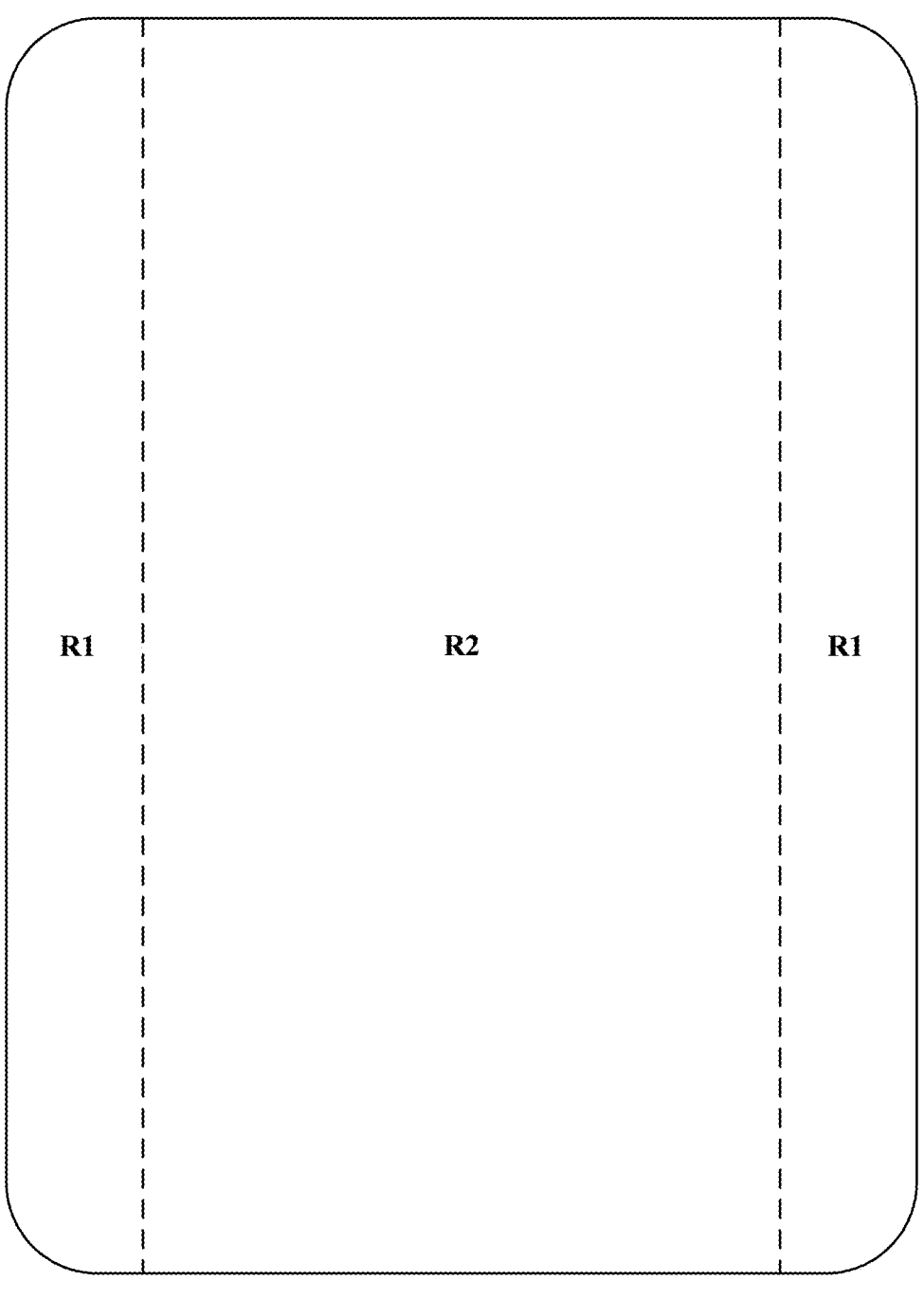

FIG. 15B is a plan view of a display substrate in some embodiments according to the present disclosure.

Figures 16, 17:
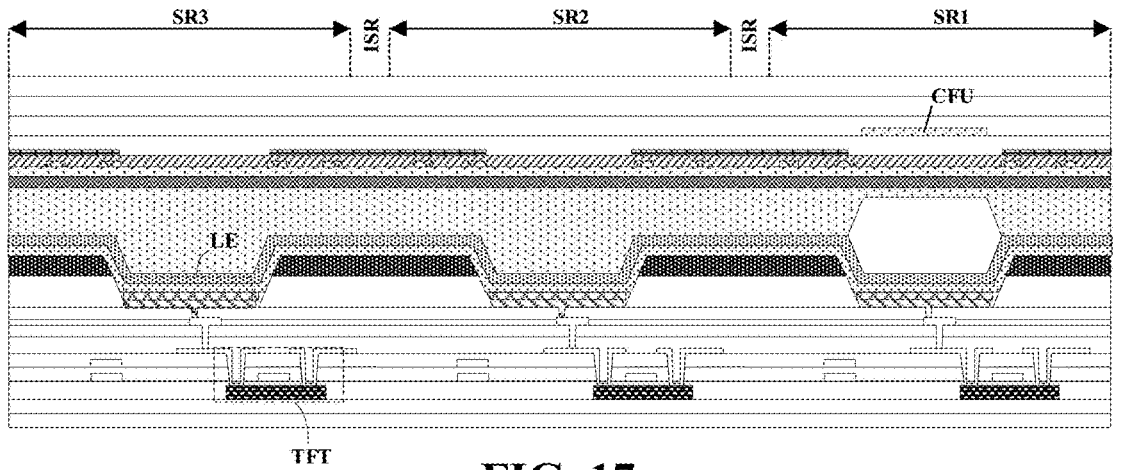

FIG. 16 is a cross-sectional view of a display substrate in some embodiments according to the present disclosure.

FIG. 17 is a cross-sectional view of a display substrate in some embodiments according to the present disclosure.

Figures 18, 19:
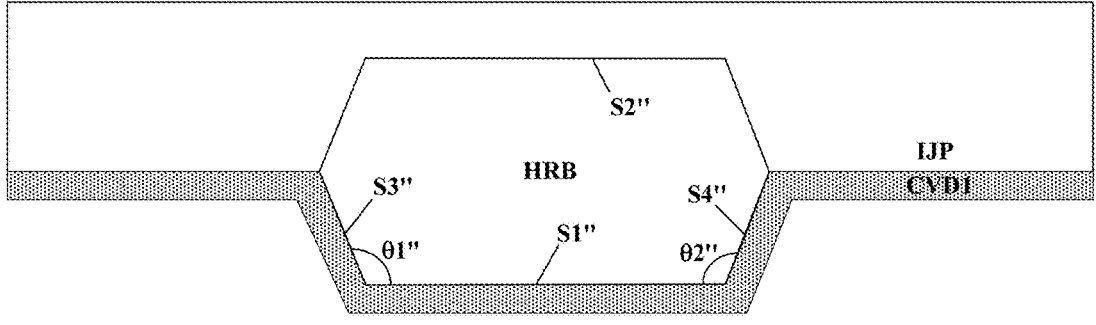

FIG. 18 is a cross-sectional view of a display substrate in some embodiments according to the present disclosure.

FIG. 19 is a schematic diagram illustrating the structure of a respective high refractive block in some embodiments according to the present disclosure.

Figure 20:
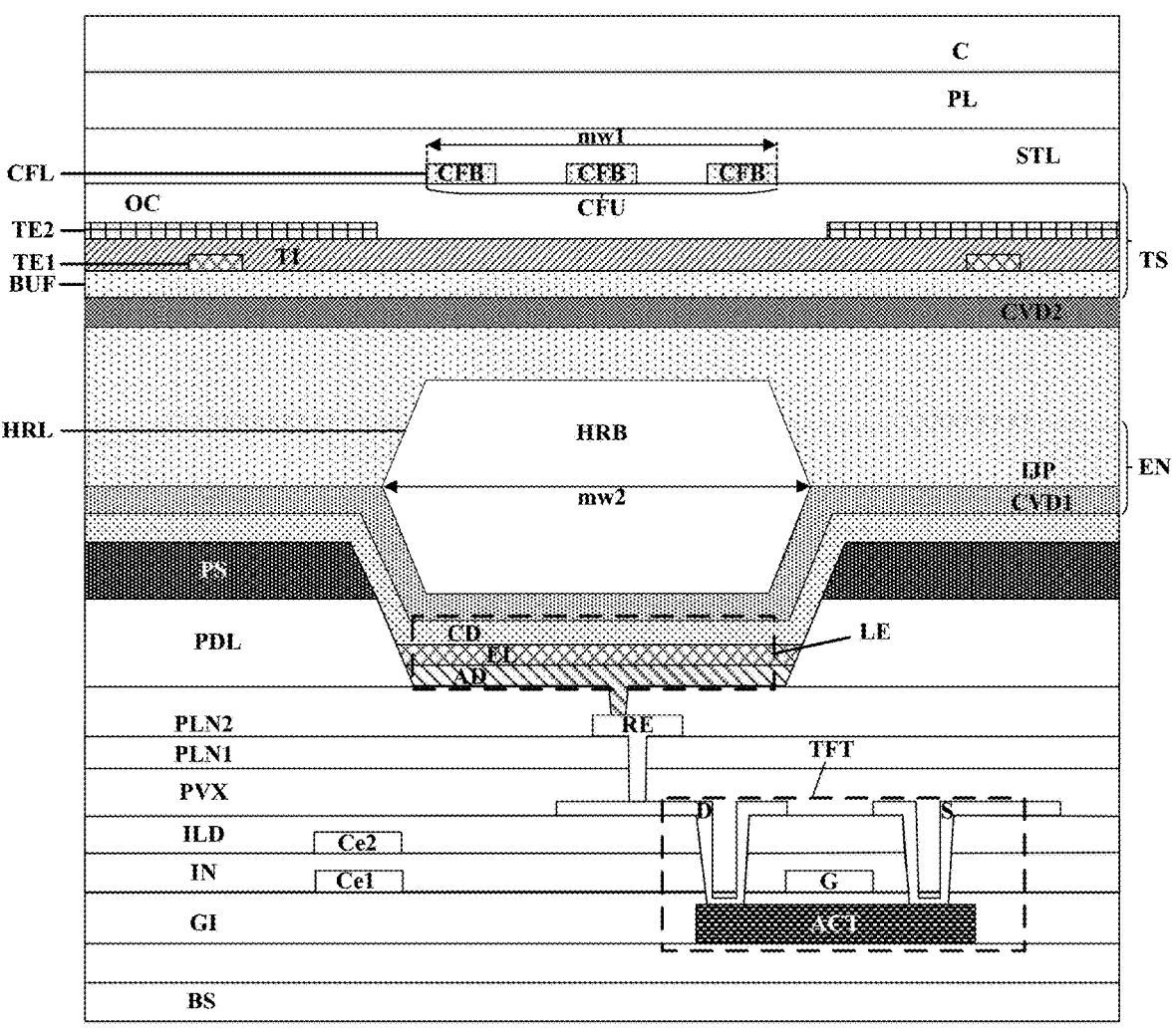

FIG. 20 is a cross-sectional view of a display substrate in some embodiments according to the present disclosure.

Figure 21:
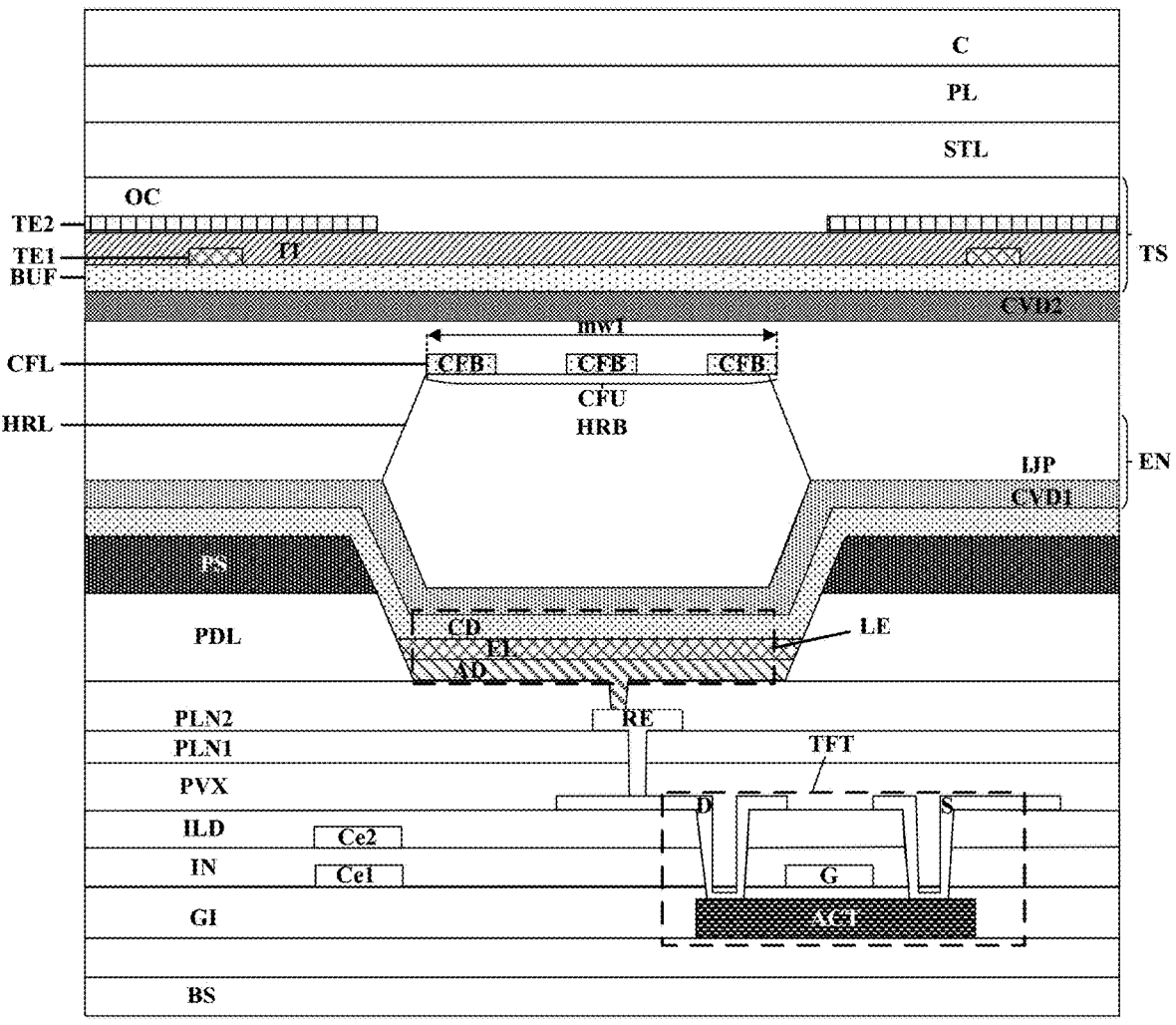

FIG. 21 is a cross-sectional view of a display substrate in some embodiments according to the present disclosure.

Figure 22:
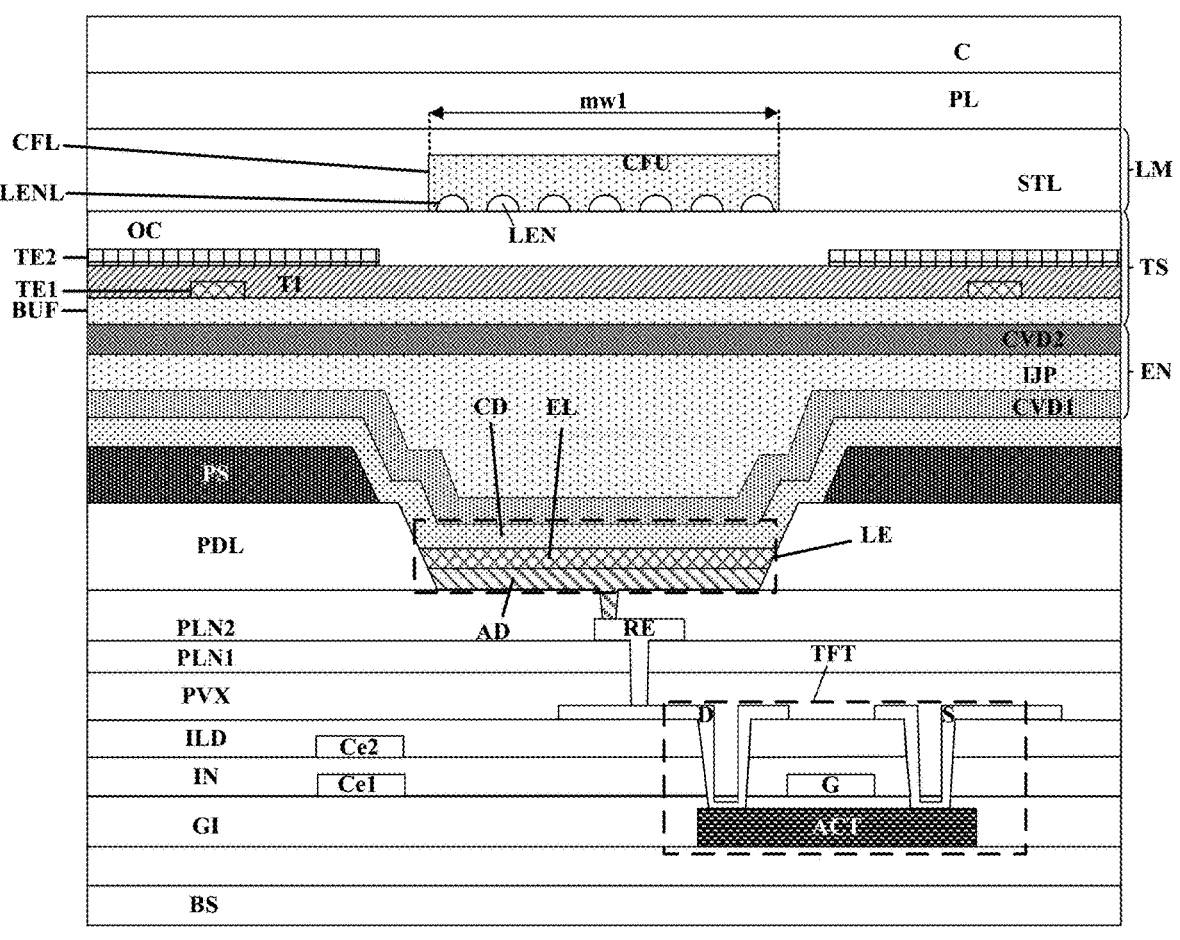

FIG. 22 is a cross-sectional view of a display substrate in some embodiments according to the present disclosure.

Figure 23:
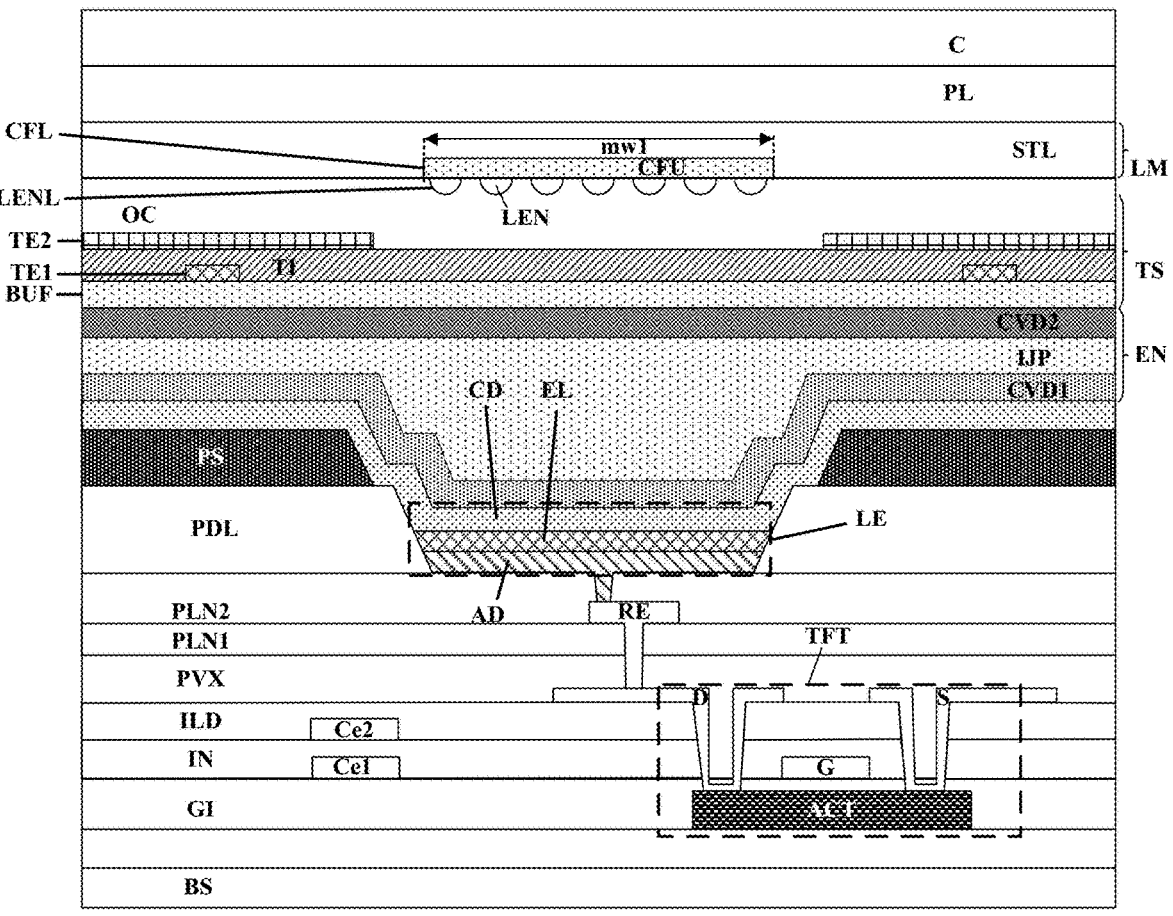

FIG. 23 is a cross-sectional view of a display substrate in some embodiments according to the present disclosure.

Figure 24:
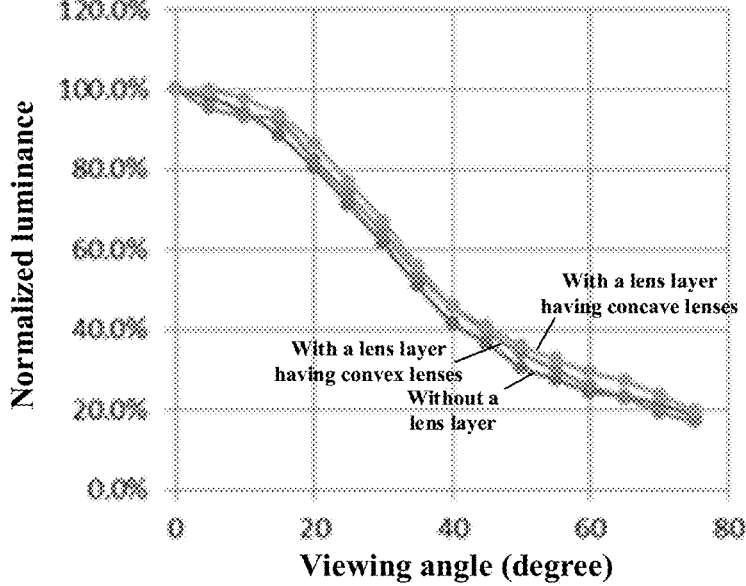

FIG. 24 shows blue light luminance decay with or without a lens layer in some embodiments according to the present disclosure.

Figure 25:
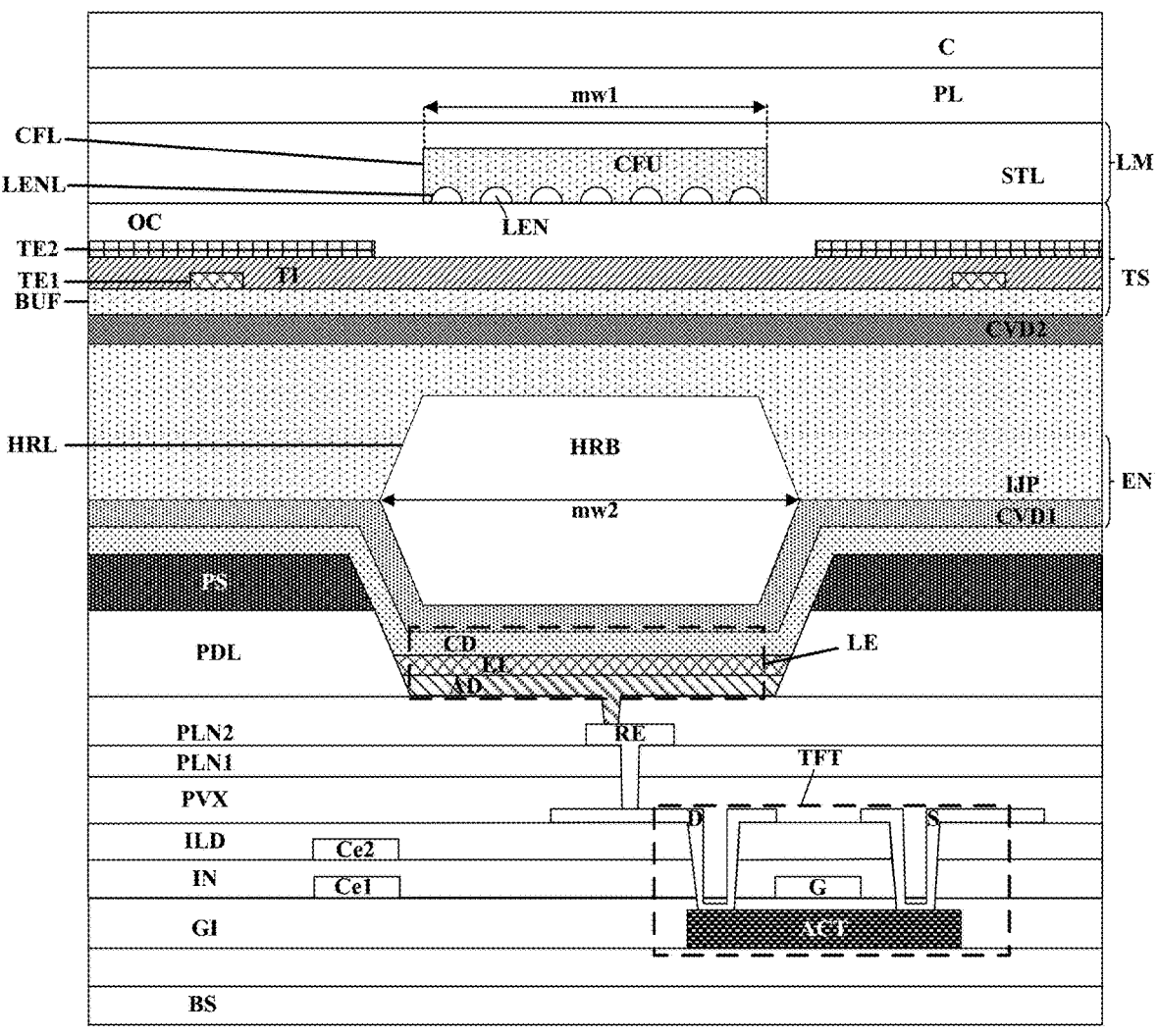

FIG. 25 is a cross-sectional view of a display substrate in some embodiments according to the present disclosure.

Figure 26:
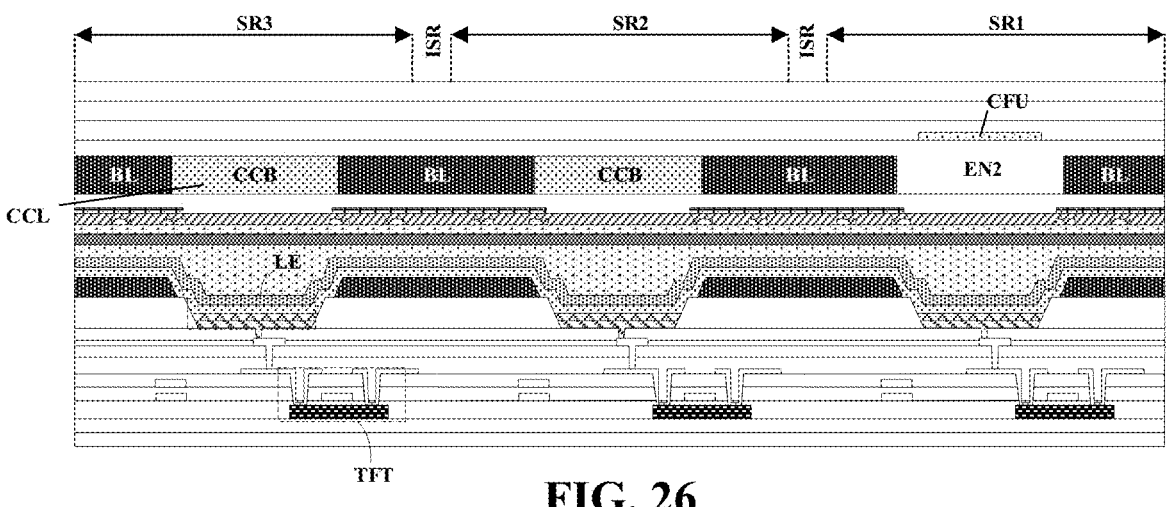

FIG. 26 is a cross-sectional view of a display substrate in some embodiments according to the present disclosure.

Figure 27:
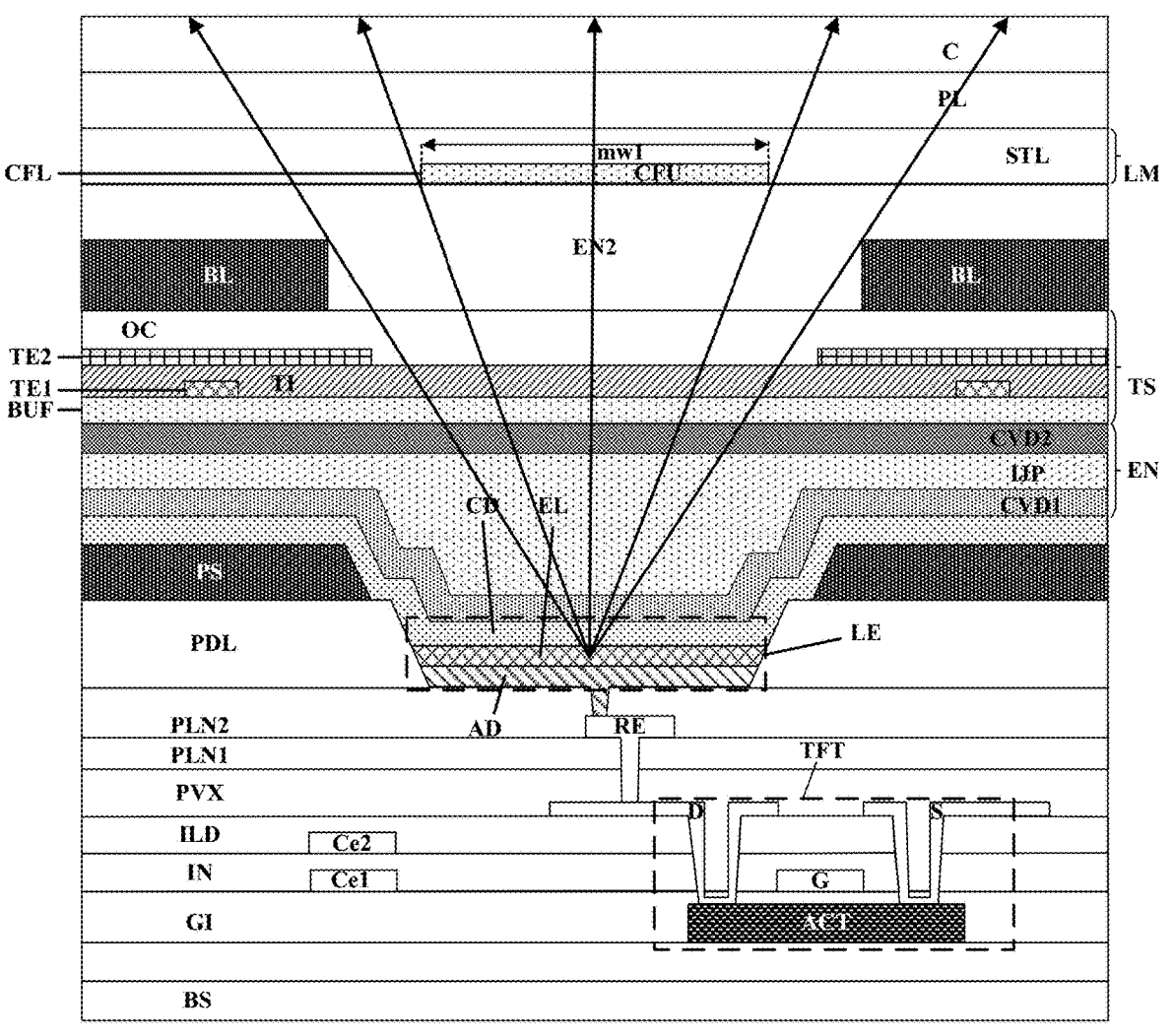

FIG. 27 is a cross-sectional view of a display substrate in some embodiments according to the present disclosure.

Figure 28:
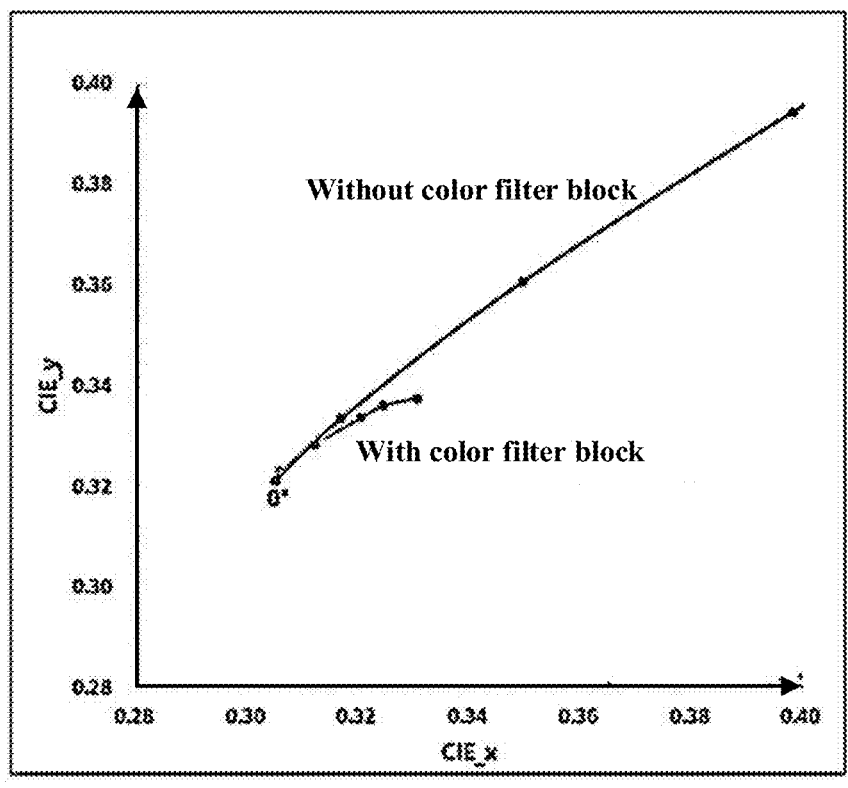

FIG. 28 shows color shift in display substrates with or without a respective color filter unit in some embodiments according to the present disclosure.

Figure 29:
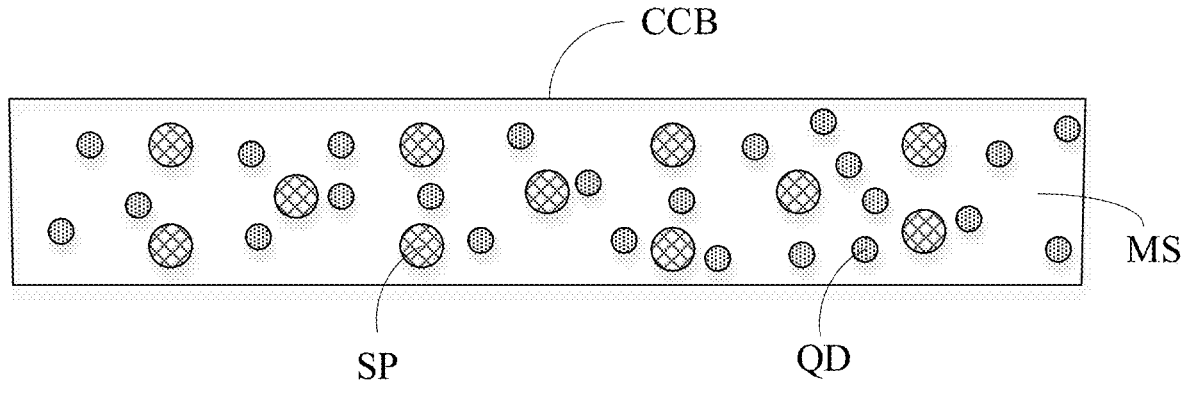

FIG. 29 is a schematic diagram illustrating the structure of a respective color conversion block in some embodiments according to the present disclosure.

Figure 30:
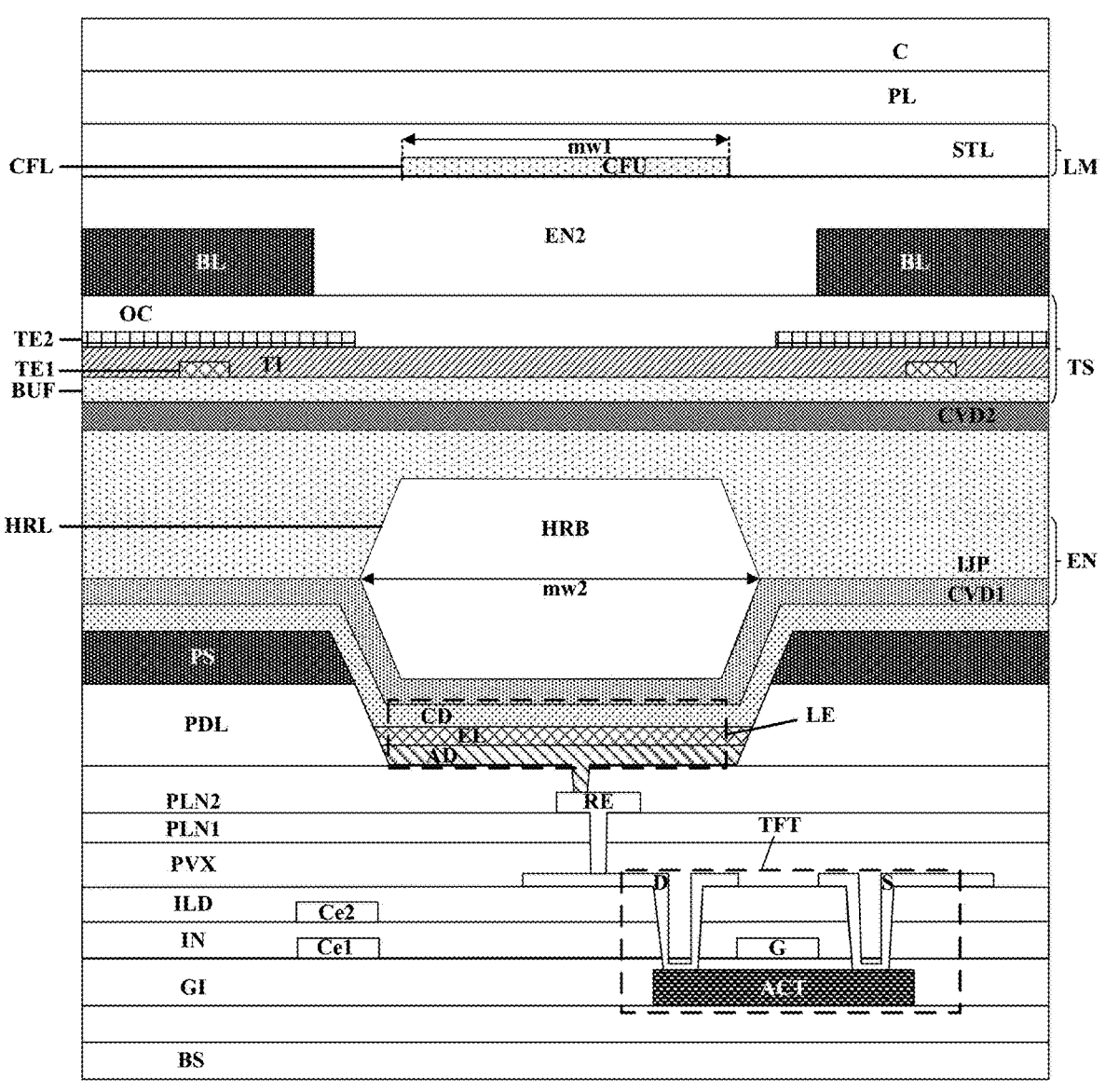

FIG. 30 is a cross-sectional view of a display substrate in some embodiments according to the present disclosure.

Figure 31:
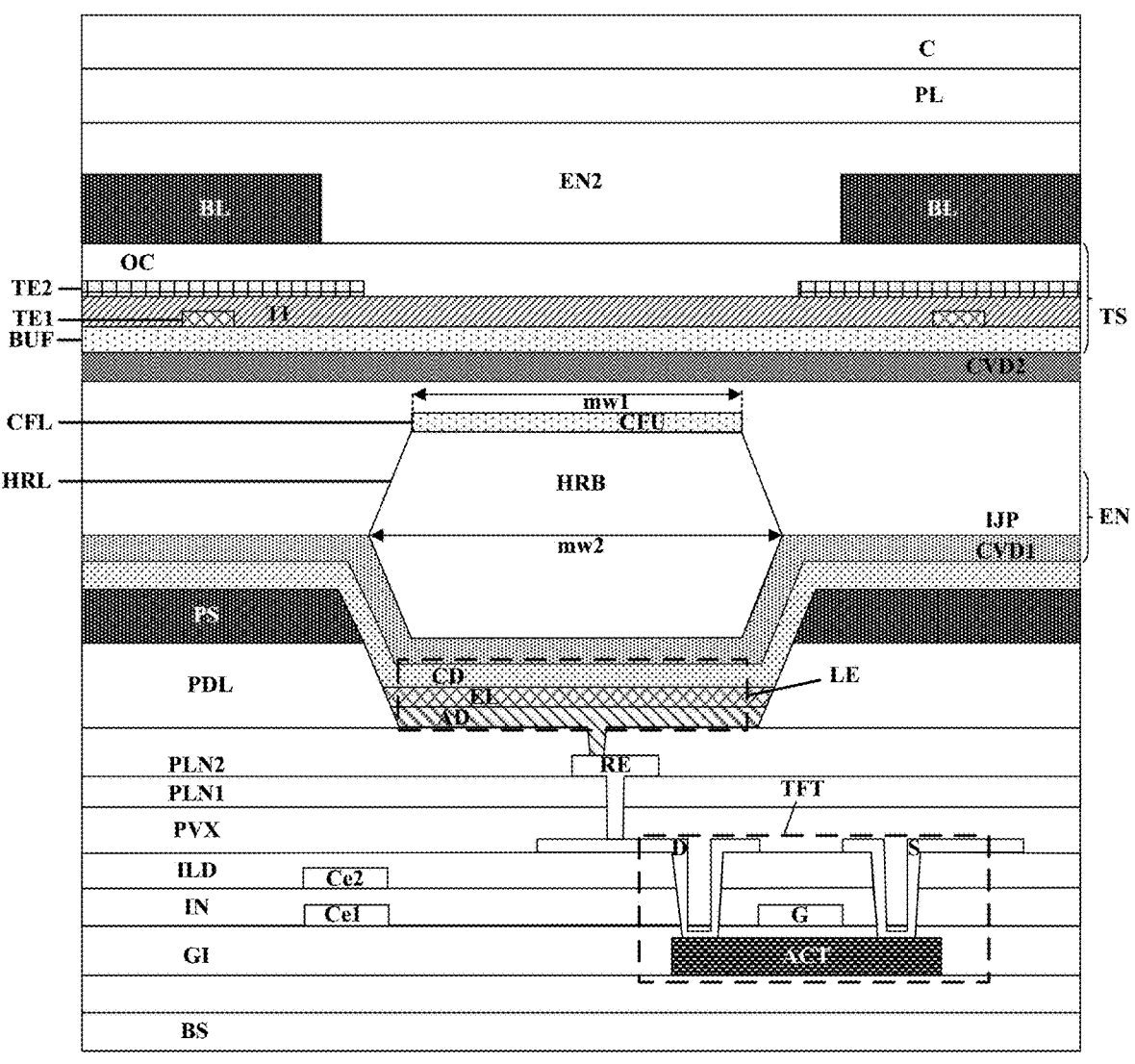

FIG. 31 is a cross-sectional view of a display substrate in some embodiments according to the present disclosure.

Figure 32:
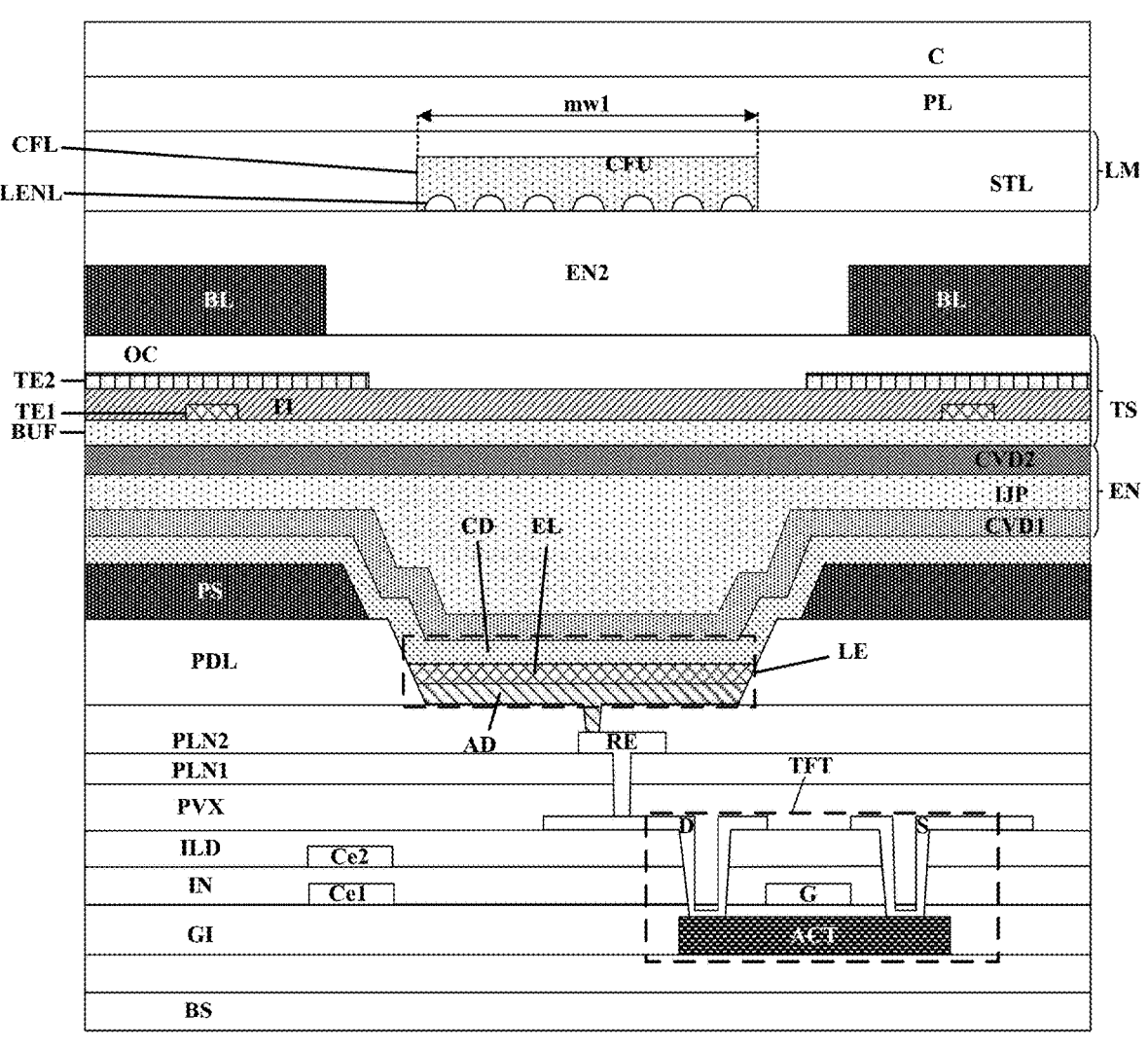

FIG. 32 is a cross-sectional view of a display substrate in some embodiments according to the present disclosure.

Figure 33:
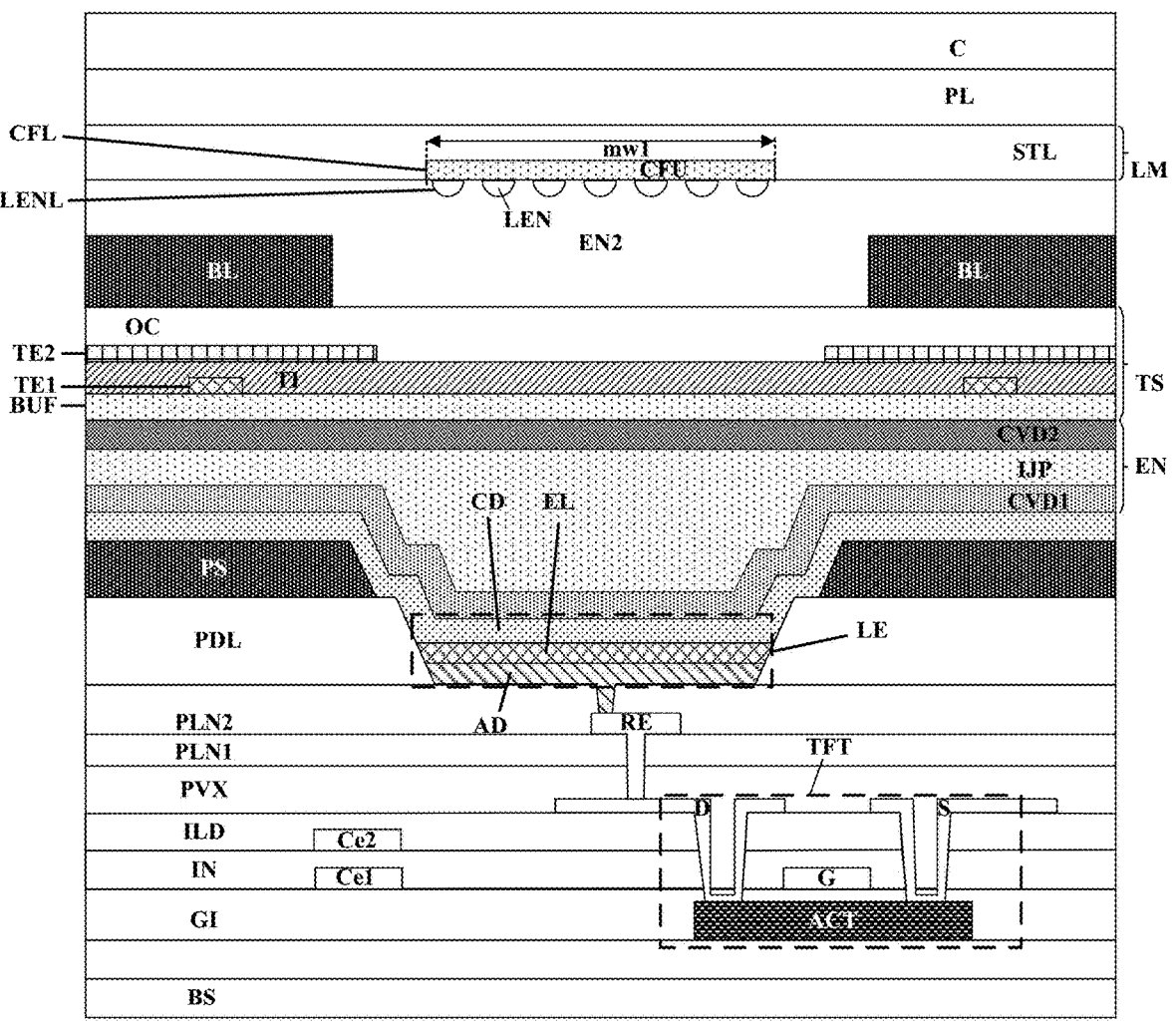

FIG. 33 is a cross-sectional view of a display substrate in some embodiments according to the present disclosure.

Figure 34:
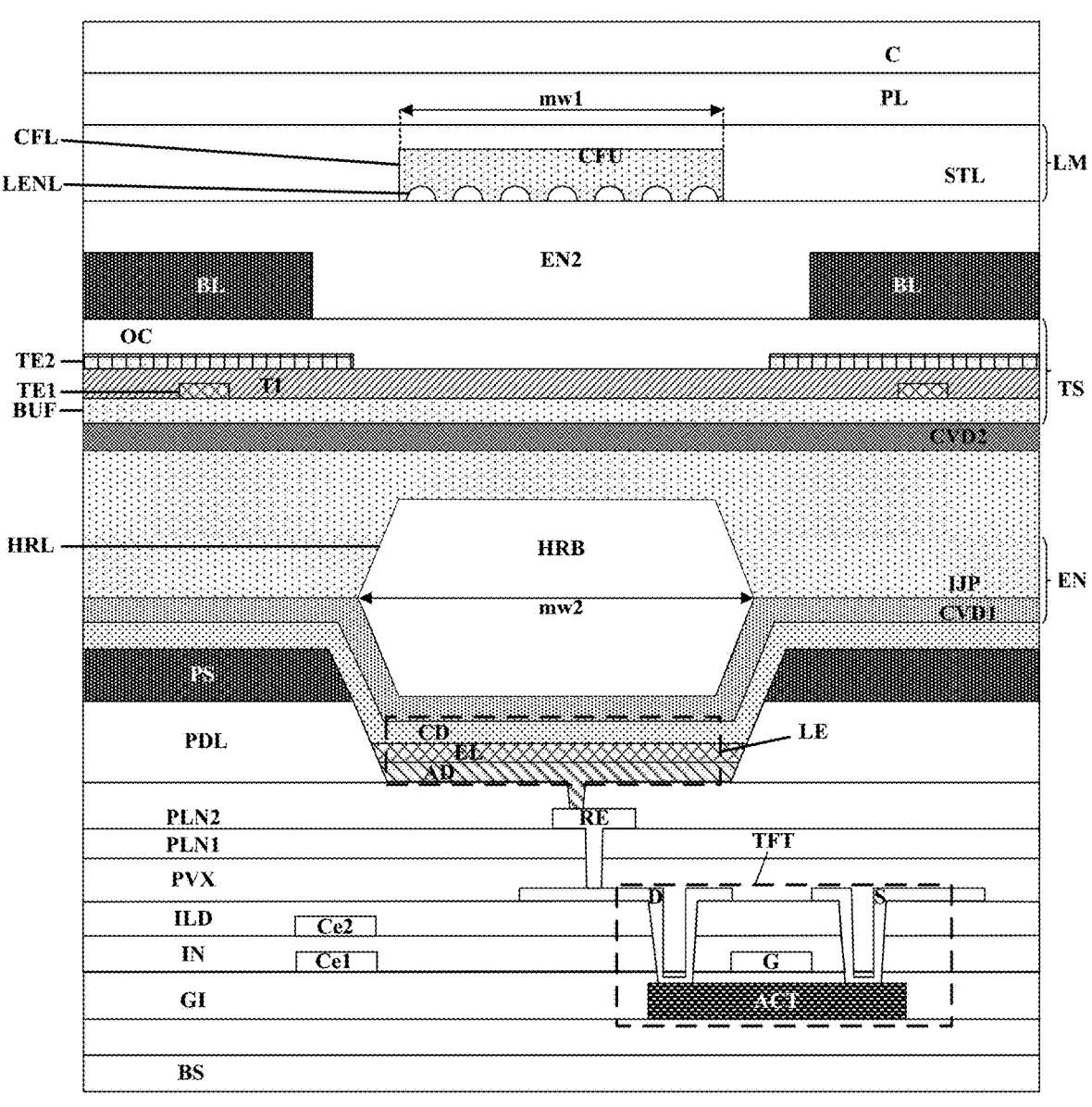

FIG. 34 is a cross-sectional view of a display substrate in some embodiments according to the present disclosure.

Figure 35:
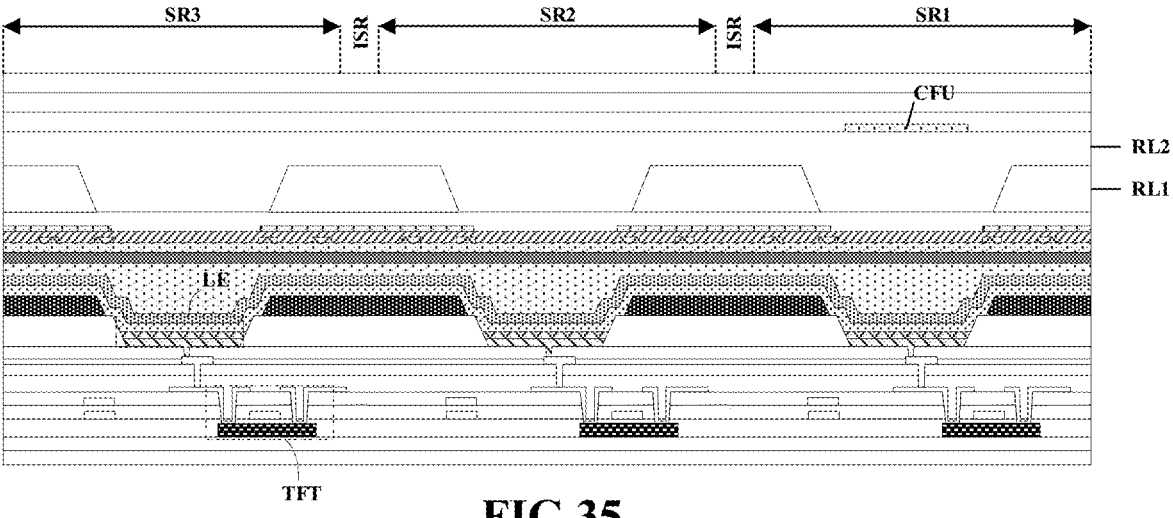

FIG. 35 is a cross-sectional view of a display substrate in some embodiments according to the present disclosure.

Figure 36:
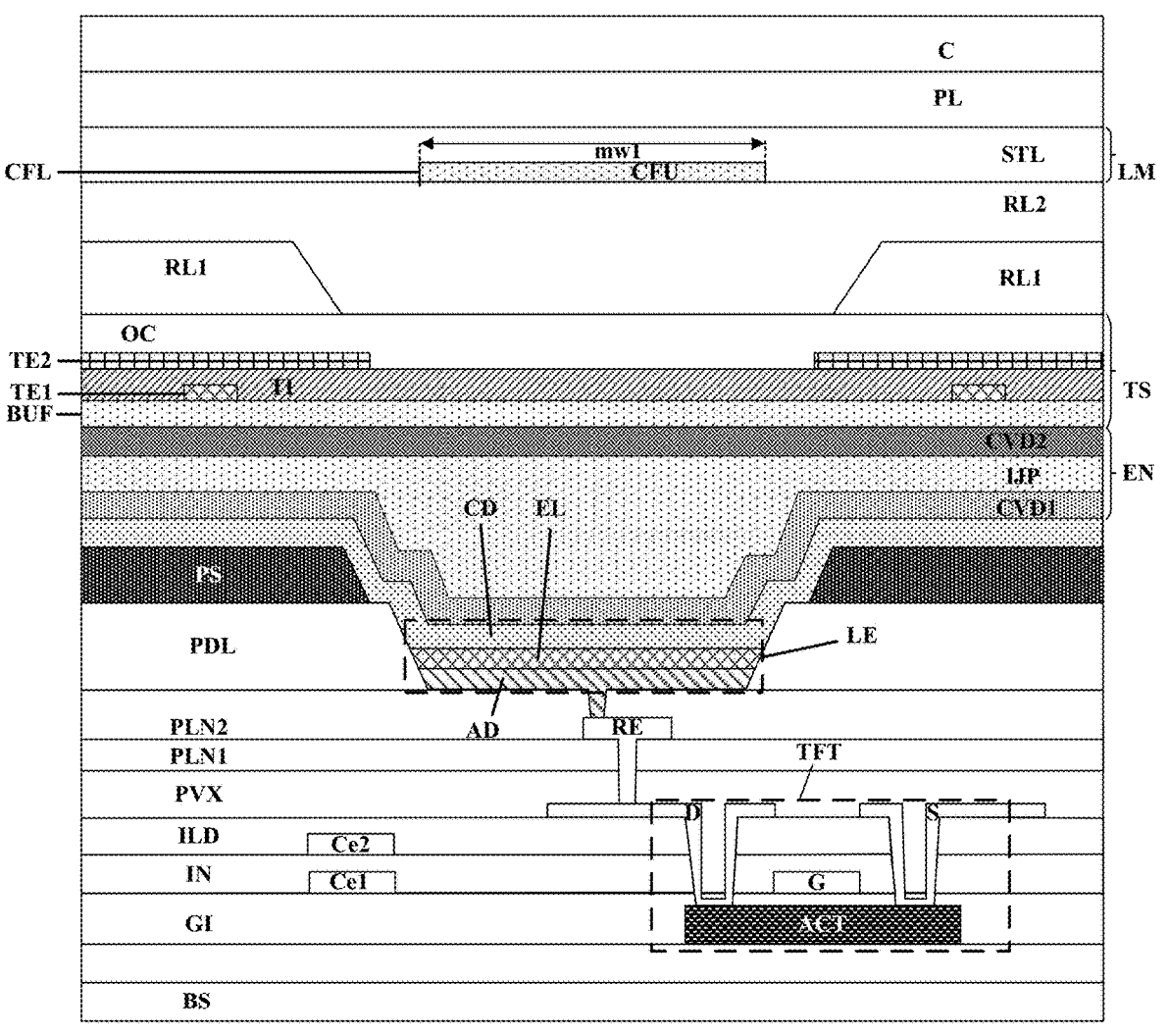

FIG. 36 is a cross-sectional view of a display substrate in some embodiments according to the present disclosure.

Figure 37:
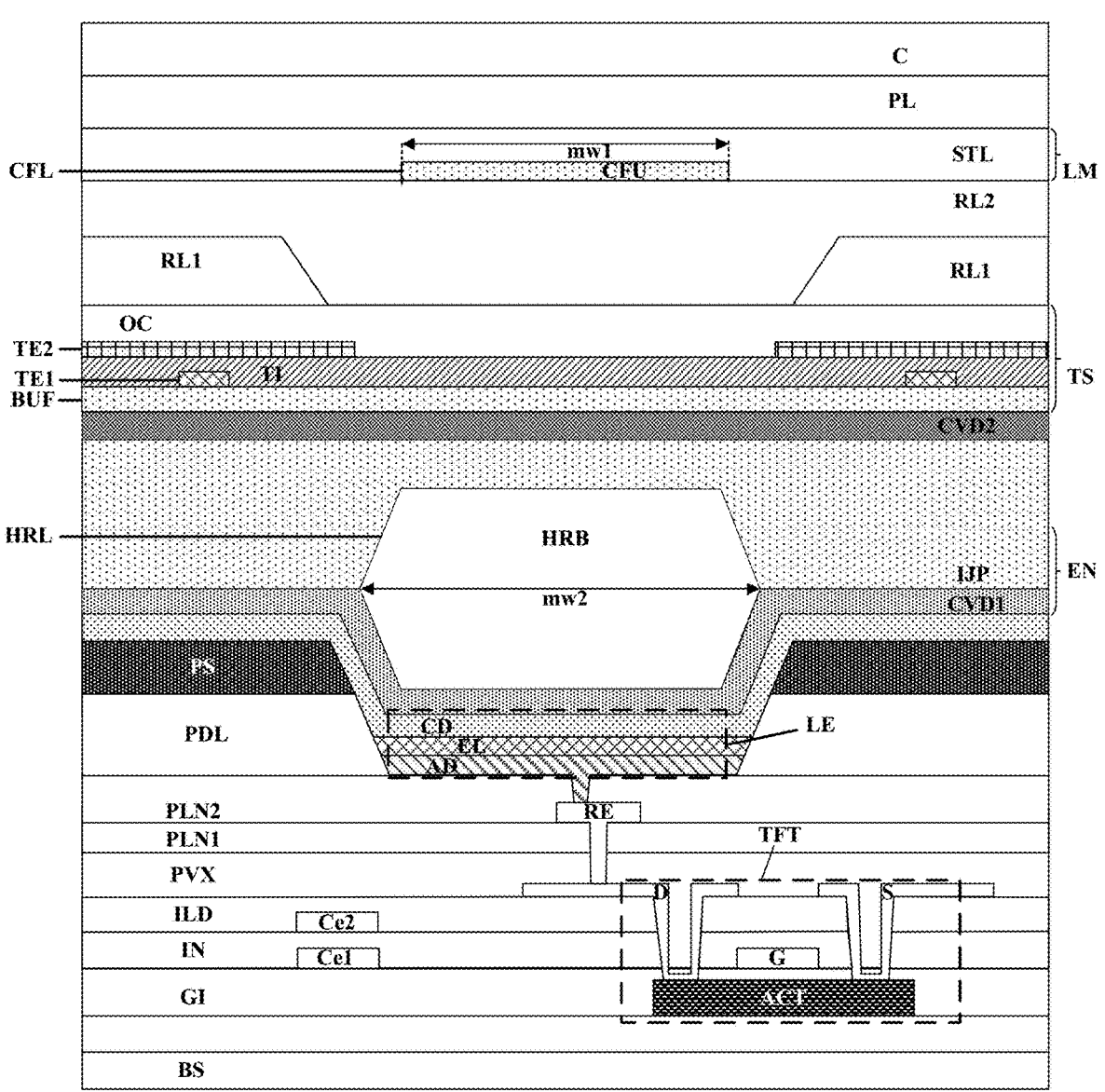

FIG. 37 is a cross-sectional view of a display substrate in some embodiments according to the present disclosure.

Figures 38, 39:
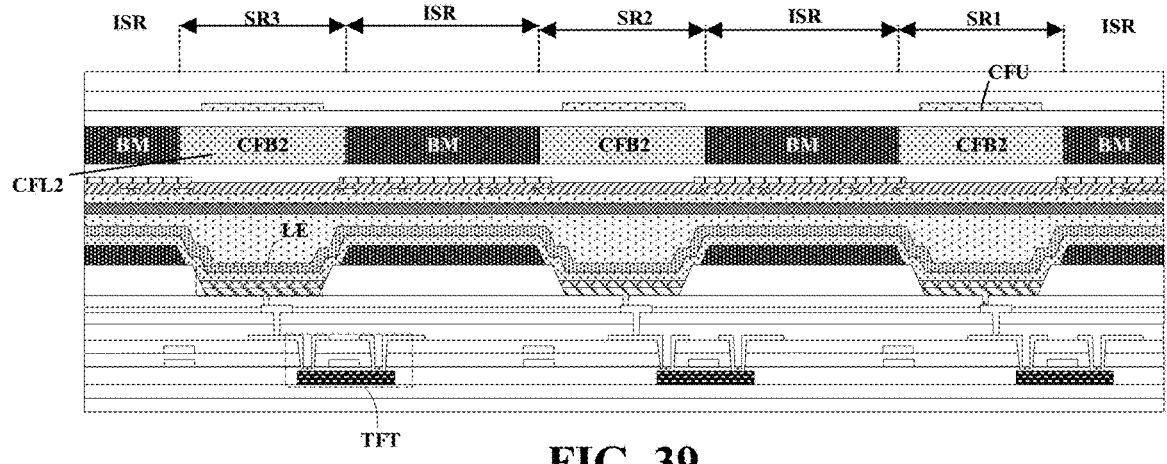

FIG. 38 is a cross-sectional view of a display substrate in some embodiments according to the present disclosure.

FIG. 39 is a cross-sectional view of a display substrate in some embodiments according to the present disclosure.

Figure 40:
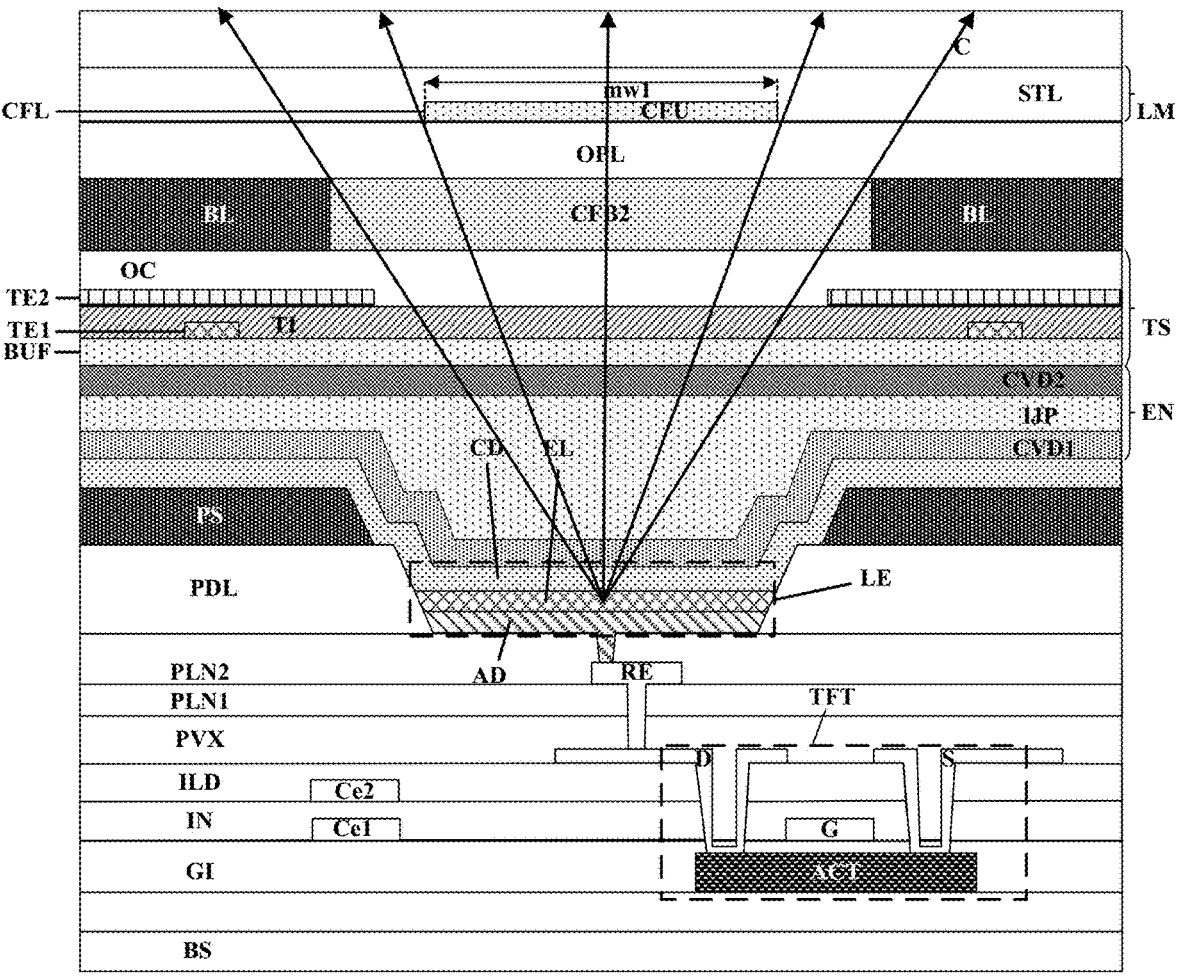

FIG. 40 is a cross-sectional view of a display substrate in some embodiments according to the present disclosure.

Figure 41:
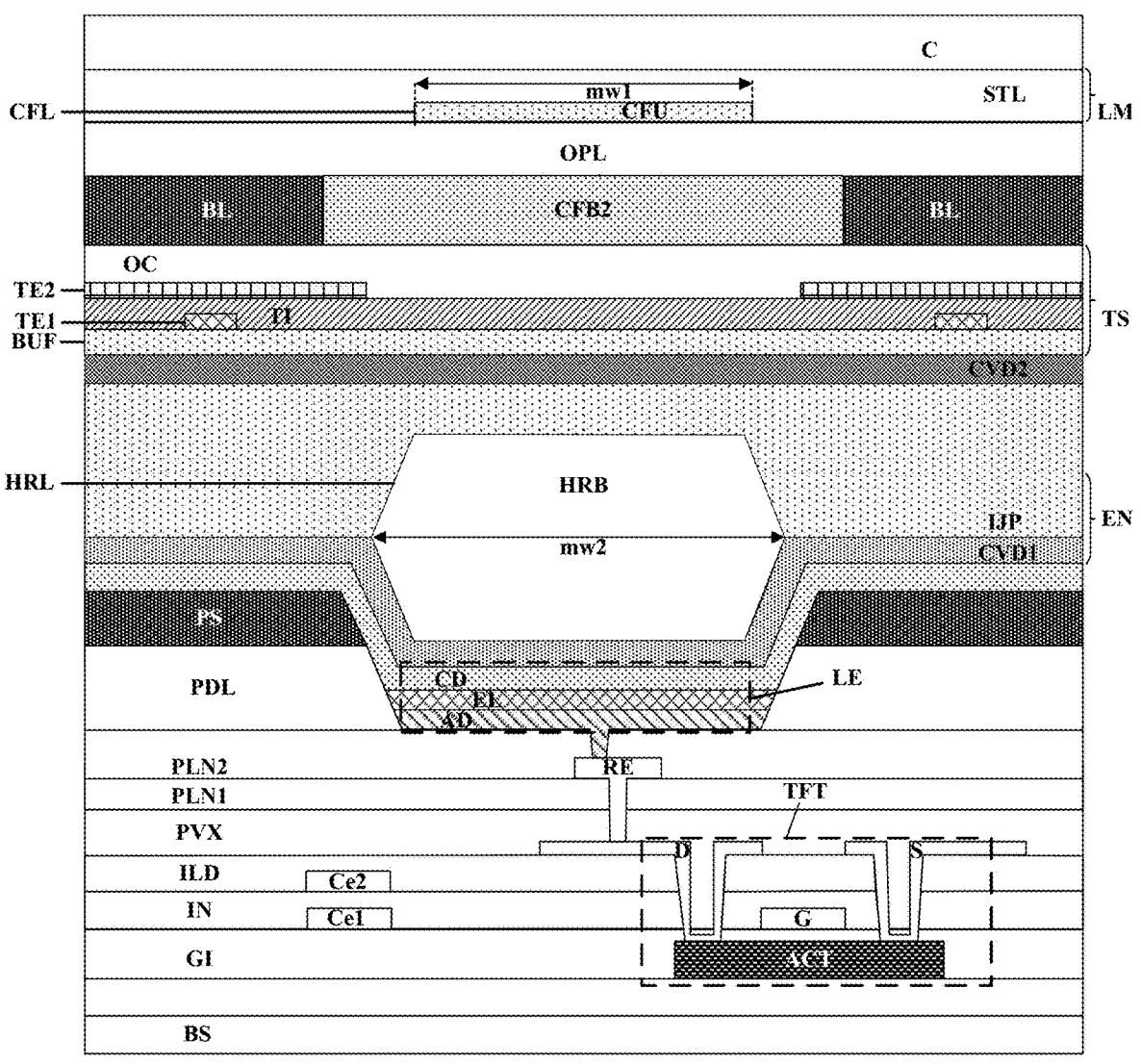

FIG. 41 is a cross-sectional view of a display substrate in some embodiments according to the present disclosure.

Figure 42:
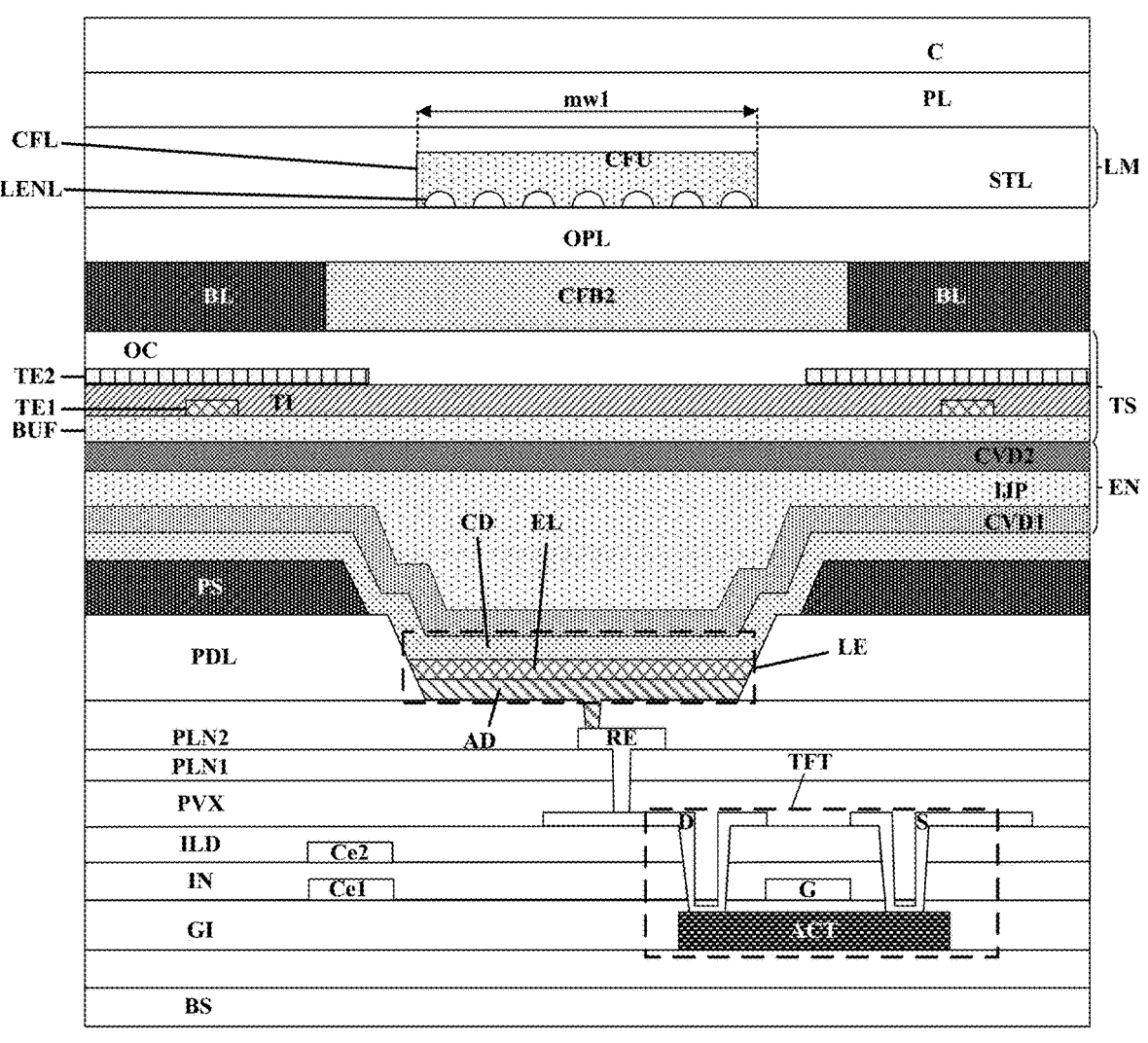

FIG. 42 is a cross-sectional view of a display substrate in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The inventors of the present disclosure discover that related light emitting diode display panels are prone to luminance decay, resulting in observable color shift in the related light emitting diode display panels. For example, subpixels of blue color is prone to luminance decay to a higher degree, yellowing is observable in the related light emitting diode display panels, particularly in related quantum dots organic light emitting diode display panels. The inventors of the present disclosure discover that, in related organic light emitting diode display panels, light emitted from subpixels of different colors undergoes different changes in brightness and/or hue with respect to viewing angles. Because the changes are inconsistent among light emitted from subpixels of different colors, color shift is more prominent at certain viewing angles, for example, at a large viewing angle. With regard to related quantum dots light emitting diode display panels, the inventors of the present disclosure observe a similar issue. Due to the nature of the Lambertian emission of quantum dots, luminance of red subpixels and green subpixels undergoes a relatively small change with respect to viewing angles, whereas luminance of blue subpixels undergoes a relatively large change. The inconsistency in luminance change among subpixels of different colors results in color shift in the related quantum dots light emitting diode display panels.

Moreover, the inventors of the present disclosure further discover that the issue of color shift becomes more severe in related bendable display panels and flexible display panels. The inventors of the present disclosure discover that the bent region or curved region are prone to color shift due to the inconsistency in luminance change among subpixels of different colors, for example, a relatively large luminance decay for light emitted from blue subpixels. FIG. 1 illustrates color shift in a bent edge of a related display panel. Referring to FIG. 1, color shift is observed in the bent edge of the related display panel.

Accordingly, the present disclosure provides, inter alia, a display substrate and a display apparatus that substantially obviate one or more of the problems due to limitations and disadvantages of the related art. In one aspect, the present disclosure provides a display substrate. In some embodiments, the display substrate includes a base substrate; a light emitting element on the base substrate; and a light modulating structure on a side of the light emitting element away from the base substrate. Optionally, the light modulating structure comprises a color filter layer and a substantially transparent layer on a side of the color filter layer away from the base substrate. Optionally, the color filter layer comprises a plurality of color filter units, a respective color filter unit of the plurality of color filter units being in an individual subpixel. Optionally, adjacent color filter units of the plurality of color filter units are spaced apart by a portion of the substantially transparent layer that extends into a region between the adjacent color filter units. Optionally, an orthographic projection of the respective color filter unit on the base substrate at least partially overlaps with an orthographic projection of a light emitting layer of the light emitting element on the base substrate.

FIG. 2 is a schematic diagram illustrating the structure of a display substrate in some embodiments according to the present disclosure. Referring to FIG. 2, the display panel in some embodiments includes a plurality of subpixel region SR and an inter-subpixel region ISR. As used herein, a subpixel region refers to a light emission region of a subpixel, such as a region corresponding to a pixel electrode in a liquid crystal display, or a region corresponding to a light emissive layer in a light emitting diode display panel. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display, or a region corresponding a pixel definition layer in a light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

FIG. 3 is a cross-sectional view along an A-A' line in FIG. 2. Referring to FIG. 3, in some embodiments, the display substrate includes a base substrate BS; an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a relay electrode RE (part of a second SD metal layer) on a side of the first planarization layer PLN1 away from the passivation layer PVX; a second planarization layer PLN2 on side of the first planarization layer PLN1 away from the passivation layer PVX; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The display substrate in the display area further includes an encapsulating layer EN encapsulating the light emitting element LE, and on a side of the cathode layer CD away from the base substrate BS.

The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the base substrate BS.

The display substrate in some embodiments further includes a touch structure TS. In some embodiments, the touch structure TS includes a buffer layer BUF on a side of the encapsulating layer EN away from the base substrate BS; a first touch electrode layer TE1 on a side of the buffer layer BUF away from the encapsulating layer EN; a touch insulating layer TI on a side of the first touch electrode layer TE1 away from the buffer layer BUF; a second touch electrode layer TE2 on a side of the touch insulating layer TI away from the buffer layer BUF; and an overcoat layer OC on a side of the second touch electrode layer TE2 away from the touch insulating layer TI.

The display substrate in some embodiments further includes a light modulating structure LM. In some embodiments, the light modulating structure LM includes a color filter layer CFL on the touch structure TS, and a substantially transparent layer STL (e.g., an optically clear adhesive layer) on a side of the color filter layer CFL away from the base substrate BS. As used herein, the term "substantially transparent" means at least 50 percent (e.g., at least 60 percent, at least 70 percent, at least 80 percent, at least 90 percent, and at least 95 percent) of an incident light in the visible wavelength range transmitted therethrough.

The display substrate in some embodiments further includes a polarizer PL on a side of the light modulating structure LM away from the base substrate BS, and a cover C on a side of the polarizer PL away from the base substrate BS.

In some embodiments, the color filter layer CFL includes a plurality of color filter units CFU. A respective color filter unit of the plurality of color filter units CFU is in an individual subpixel.

In some embodiments, an orthographic projection of the respective color filter unit on the base substrate BS at least partially overlaps with an orthographic projection of the light emitting layer EL on the base substrate BS.

In some embodiments, the respective color filter unit is configured to filter light emitted from the light emitting layer EL. A first portion of light transmits through the respective color filter unit and out of the display substrate. A second portion of light emitted from the light emitting layer EL transmits out of the display substrate without transmitting through the respective color filter unit. The first portion and the second portion in combination display a subpixel image. The first portion transmits out of the display substrate in a first range of viewing angles. The second portion transmits out of the display substrate in a second range of viewing angles. The second range of viewing angles is greater than the first range of viewing angles.

In some embodiments, at least 5% (e.g., at least 10%, at least 15%, at least 20%, at least 25%, at least 30%, at least 35%, at least 40%, at least 45%, at least 50%, at least 55%, at least 60%, at least 65%, at least 70%, at least 75%, or at least 80%) of light emitted from the light emitting layer EL transmits through the respective color filter unit, forming the first portion.

In some embodiments, no more than 90% (e.g., no more than 85%, no more than 80%, no more than 75%, no more than 70%, no more than 65%, no more than 60%, no more than 55%, no more than 50%, no more than 45%, no more than 40%, no more than 35%, no more than 30%, no more than 25%, no more than 20%, no more than 15%, no more than 10%, or no more than 5%) of light emitted from the light emitting layer EL transmits through the respective color filter unit, forming the first portion.

In some embodiments, at least 5% (e.g., at least 10%, at least 15%, at least 20%, at least 25%, at least 30%, at least 35%, at least 40%, at least 45%, at least 50%, at least 55%, at least 60%, at least 65%, at least 70%, at least 75%, or at least 80%) of light emitted from the light emitting layer EL transmits out of the display substrate without transmitting through the respective color filter unit, forming the second portion.

In some embodiments, no more than 90% (e.g., no more than 85%, no more than 80%, no more than 75%, no more than 70%, no more than 65%, no more than 60%, no more than 55%, no more than 50%, no more than 45%, no more than 40%, no more than 35%, no more than 30%, no more than 25%, no more than 20%, no more than 15%, no more than 10%, or no more than 5%) of light emitted from the light emitting layer EL transmits out of the display substrate without transmitting through the respective color filter unit, forming the second portion.

Referring to FIG. 3, in a cross-section along a plane perpendicular to the base substrate and intersecting a plurality of subpixels (e.g., the cross-section depicted in FIG. 3), the respective color filter unit has a first maximum width mw1.

FIG. 4 illustrates a subpixel aperture in a respective subpixel in a display substrate in some embodiments according to the present disclosure. Referring to FIG. 4, the pixel definition layer PDL defines a subpixel aperture SA. In a cross-section along a plane perpendicular to the base substrate and intersecting a plurality of subpixels (e.g., the cross-section depicted in FIG. 3 or FIG. 4), the subpixel aperture SA has an aperture width aw.

In some embodiments, the first maximum width mw1 and the aperture width aw are substantially the same. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value. In one example, mw1=aw±0.1 µm.

FIG. 5 shows light transmittance rate through a respective color filter unit in some embodiments according to the present disclosure. Referring to FIG. 5, light transmittance rate through the respective color filter unit ranges from 60% to 80%. The light transmittance rates for color filter units of a red color, a green color, and a blue color are substantially the same. The light transmittance rates decrease with an increase in a thickness of the respective color filter unit. In one example, the thickness of the respective color filter unit is in a range of 2 µm to 4 µm.

FIG. 6 shows light transmittance rate through a substantially transparent layer in some embodiments according to the present disclosure. Referring to FIG. 6, light transmittance rate through the substantially transparent layer is greater than 95%. The light transmittance rates for a red light, a green light, and a blue light are substantially the same. The light transmittance rates decrease with an increase in a thickness of the substantially transparent layer.

FIG. 7 shows blue light luminance decay with or without a respective color filter unit in some embodiments according to the present disclosure. Referring to FIG. 7, with or without the respective color filter, luminance decay increases as the viewing angle increases. The light luminance decay in a display substrate with the respective color filter unit is significantly less than the light luminance decay in a display substrate without the respective color filter unit. This is because, at the large viewing angle, the second portion of light emitted from the light emitting layer EL transmits out of the display substrate without transmitting through the respective color filter unit.

FIG. 8 is a cross-sectional view along a B-B' line in FIG. 2. Referring to FIG. 8, the display substrate in some embodiments includes a plurality of subpixel regions, including a first subpixel region SR1, a second subpixel region SR2, and a third subpixel region SR3. In some embodiments, the color filter layer CFL is present in the first subpixel region SR1, and is absent in at least one of the second subpixel region SR2 or the third subpixel region SR3. In some embodiments, the first subpixel region SR1 is a subpixel region of a first color, the second subpixel region SR2 is a subpixel region of a second color, and the third subpixel region SR3 is a subpixel region of a third color. Optionally, the first color, the second color, and the third color are three different colors selected from the group consisting of red, blue, and green. In one example, the first color is a blue color, the second color is a red color, and the third color is a green color.

In an alternative embodiment, the color filter layer CFL is present in all of the first subpixel region SR1, the second subpixel region SR2, and the third subpixel region SR3. The plurality of color filter blocks are respectively in a plurality of subpixel regions including subpixel regions of a first color, subpixel regions of a second color, and subpixel regions of a third color.

FIG. 9 is a schematic diagram illustrating the structure of a light modulating structure in some embodiments according to the present disclosure. Referring to FIG. 9, the respective color filter unit of the plurality of color filter units CFU is on a side of a first adjacent layer (e.g., an overcoat layer OC) away from the base substrate, and on a side of a second adjacent layer (e.g., a substantially transparent layer STL) closer to the base substrate. The respective color filter unit is in direct contact with the first adjacent layer and in direct contact with the second adjacent layer. In some embodiments, in a cross-section along a plane perpendicular to the base substrate and intersecting a plurality of subpixels (e.g., the cross-section depicted in FIG. 3), the respective color filter unit has a first side S1, a second side S2 opposite to the first side S1, a third side S3 connecting the first side S1 and the second side S2, and a fourth side S4 connecting the first side S1 and the second side S2, the fourth side S4 being opposite to the third side S3. The first side S1 is on a side of the second side S2 closer to the base substrate. The first side S1 connects the third side S3 and the fourth side S4.

In some embodiments, in the cross-section along the plane perpendicular to the base substrate and intersecting a plurality of subpixels, the first side S1 of the respective color filter unit has a first width, the second side S2 of respective color filter unit has a second width. Optionally, the second width is greater than the first width.

In some embodiments, a first included angle between the third side S3 and the first side S1 is denoted as θ1, and a second included angle between the fourth side S4 and the first side S1 is denoted as θ2. Optionally, the first included angle θ1 is in a range of 60 degrees to 140 degrees. Optionally, the second included angle θ2 is in a range of 60 degrees to 140 degrees.

The inventors of the present disclosure discover that, surprisingly and unexpectedly, light luminance decay can be significantly reduced when the first included angle θ1 and the second included angle θ2 are in a range of 100 degrees to 140 degrees, e.g., 100 degrees to 110 degrees, 110 degrees to 120 degrees, 120 degrees to 130 degrees, or 130 degrees to 140 degrees. In one example, the first included angle θ1 and the second included angle θ2 are approximately 120 degrees. In some embodiments, in the cross-section along the plane perpendicular to the base substrate and intersecting a plurality of subpixels, the respective color filter unit has an inverted trapezoidal shape.

FIG. 10 is a cross-sectional view of a display substrate in some embodiments according to the present disclosure. FIG. 11 is a superimposed view of a respective color filter unit and a light emitting layer in some embodiments according to the present disclosure. Referring to FIG. 10 and FIG. 11, the respective color filter unit CFU in some embodiments includes a plurality of color filter blocks CFB. In some embodiments, the substantially transparent layer STL extends into regions between adjacent color filter blocks of the plurality of color filter blocks CFB.

FIG. 12 is a cross-sectional view of a display substrate in some embodiments according to the present disclosure. FIG. 13 is a superimposed view of a respective color filter unit and a light emitting layer in some embodiments according to the present disclosure. Referring to FIG. 12 and FIG. 13, the display substrate in some embodiments further includes a fill layer FIL. The fill layer FIL and the respective color filter block are on a side of a first adjacent layer (e.g., an overcoat layer OC) away from the base substrate, and on a side of a second adjacent layer (e.g., a substantially transparent layer STL) closer to the base substrate. The fill layer FIL and the respective color filter block are in direct contact with the first adjacent layer and in direct contact with the second adjacent layer. In some embodiments, the fill layer FIL is in a region between adjacent color filter blocks of the plurality of color filter blocks CFB.

In some embodiments, the fill layer FIL includes a light scattering material. Examples of appropriate light scattering materials include $TiO_2$, $ZnO$, $ZrO_2$, $Al_2O_3$, $SiO_2$.

The light luminance decay in a display substrate having a plurality of color filter blocks CFB is significantly less than the light luminance decay in a display substrate without the respective color filter unit. At a large viewing angle, the second portion of light emitted from the light emitting layer EL transmits out of the display substrate without transmitting through the respective color filter unit, thereby reducing the light luminance decay. As compared to the display substrate depicted in FIG. 3, the second portion additionally includes a portion of light transmitting through a region between adjacent color filter blocks without transmitting through the color filter blocks in the display substrates depicted in FIG. 10 and FIG. 12.

FIG. 14 is a schematic diagram illustrating the structure of a respective color filter block in some embodiments according to the present disclosure. Referring to FIG. 14, the respective color filter block is on a side of a first adjacent layer (e.g., an overcoat layer OC) away from the base substrate, and on a side of a second adjacent layer (e.g., a substantially transparent layer STL) closer to the base substrate. The respective color filter block is in direct contact with the first adjacent layer and in direct contact with the second adjacent layer. In some embodiments, in a cross-section along a plane perpendicular to the base substrate and intersecting a plurality of subpixels (e.g., the cross-section depicted in FIG. 10 or FIG. 12), the respective color filter block has a first side S1', a second side S2' opposite to the first side S1', a third side S3' connecting the first side S1' and the second side S2', and a fourth side S4' connecting the first side S1' and the second side S2', the fourth side S4' being opposite to the third side S3'. The first side S1' is on a side of the second side S2' closer to the base substrate. The first side S1' connects the third side S3' and the fourth side S4'.

In some embodiments, in the cross-section along the plane perpendicular to the base substrate and intersecting a plurality of subpixels, the first side S1' of the respective color filter block has a first width, the second side S2' of respective color filter block has a second width. Optionally, the second width is greater than the first width.

In some embodiments, a first included angle between the third side S3' and the first side S1' is denoted as θ1', and a second included angle between the fourth side S4' and the first side S1' is denoted as θ2'. Optionally, the first included angle θ1' is in a range of 60 degrees to 140 degrees. Optionally, the second included angle θ2' is in a range of 60 degrees to 140 degrees.

The inventors of the present disclosure discover that, surprisingly and unexpectedly, light luminance decay can be significantly reduced when the first included angle θ1' and the second included angle θ2' are in a range of 100 degrees to 140 degrees, e.g., 100 degrees to 110 degrees, 110 degrees to 120 degrees, 120 degrees to 130 degrees, or 130 degrees to 140 degrees. In one example, the first included angle θ1' and the second included angle θ2' are approximately 120 degrees. In some embodiments, in the cross-section along the plane perpendicular to the base substrate and intersecting a plurality of subpixels, the respective color filter block has an inverted trapezoidal shape.

FIG. 15A is a cross-sectional view of a display substrate in some embodiments according to the present disclosure. FIG. 15B is a plan view of a display substrate in some embodiments according to the present disclosure. Referring to FIG. 15A and FIG. 15B, a display area of the display substrate in some embodiments includes one or more first regions R1 and a second region R2. In some embodiments, the one or more first regions R1 is a bendable region or a bent region as depicted in FIG. 15A and FIG. 15B, and the second region R2 is an unbent region. In some embodiments, the light modulating structure LM is present in the one or more first region R1, and is absent in the second region R2. Optionally, the plurality of color filter blocks are present in the first subpixel region in the one or more first region R1, and is absent in the second region R2 and absent in at least one of the second subpixel region or the third subpixel region in the one or more first regions R1. The inventors of the present disclosure discover that, by having the color filter layer in the one or more first regions R1, the light transmittance rate in the one or more first regions R1 can be improved by at least 8% to 12%.

The inventors of the present disclosure further discover that due to the difference between the first inorganic encapsulating sub-layer and the organic encapsulating sub-layer, a portion of light entered into the first inorganic encapsulating sub-layer is totally reflected, resulting in loss of light transmittance rate. The inventors of the present disclosure further discover that a high refractive layer between the first inorganic encapsulating sub-layer and the organic encapsulating sub-layer can significantly increase light transmittance rate and reduce light luminance loss in the display substrate.

FIG. 16 is a cross-sectional view of a display substrate in some embodiments according to the present disclosure. Referring to FIG. 16, the light modulating structure in the display substrate in some embodiments includes a high refractive layer HRL and a color filter layer CFL. In some embodiments, the color filter layer CFL includes a plurality of color filter units CFU. A respective color filter unit of the plurality of color filter units CFU is in an individual subpixel. In some embodiments, the high refractive layer HRL includes a plurality of high refractive blocks HRB. A respective high refractive block of the plurality of high refractive blocks HRB is in an individual subpixel.

In some embodiments, the respective high refractive block is on a side of the first inorganic encapsulating sub-layer CVD1 away from the base substrate BS, and on a side of the organic encapsulating sub-layer IJP closer to the base substrate BS. In some embodiments, the respective high refractive block is in direct contact with the first inorganic encapsulating sub-layer CVD1, and in direct contact with the organic encapsulating sub-layer IJP.

In some embodiments, an orthographic projection of the respective color filter unit on the base substrate BS at least partially overlaps with an orthographic projection of the light emitting layer EL on the base substrate BS. In some embodiments, an orthographic projection of the respective high refractive block on the base substrate BS at least partially overlaps with the orthographic projection of the light emitting layer EL on the base substrate BS.

In some embodiments, the respective color filter unit is configured to filter light emitted from the light emitting layer EL. A first portion of light transmits through the respective color filter unit and out of the display substrate. A second portion of light emitted from the light emitting layer EL transmits out of the display substrate without transmitting through the respective color filter unit. The first portion and the second portion in combination display a subpixel image. The first portion transmits out of the display substrate in a first range of viewing angles. The second portion transmits out of the display substrate in a second range of viewing angles. The second range of viewing angles is greater than the first range of viewing angles.

Referring to FIG. 16, in a cross-section along a plane perpendicular to the base substrate and intersecting a plurality of subpixels (e.g., the cross-section depicted in FIG. 3), the respective color filter unit has a first maximum width mw1. In some embodiments, in a cross-section along a plane perpendicular to the base substrate and intersecting a plurality of subpixels (e.g., the cross-section depicted in FIG. 16), the respective high refractive block has a second maximum width mw2. Referring to FIG. 4, the pixel definition layer PDL defines a subpixel aperture SA. In a cross-section along a plane perpendicular to the base substrate and intersecting a plurality of subpixels (e.g., the cross-section depicted in FIG. 16 or FIG. 4), the subpixel aperture SA has an aperture width aw.

In some embodiments, the first maximum width mw1 and the aperture width aw are substantially the same. In one example, mw1=aw±0.1 μm. In some embodiments, the second maximum width mw2 and the aperture width aw are substantially the same. In one example, mw2=aw±0.1 μm.

Referring to FIG. 16, the display substrate in some embodiments further includes a touch structure TS. The color filter layer CFL is on a side of the touch structure TS away from the base substrate BS. Optionally, the display substrate includes a light emitting element LE on the base substrate BS; a first inorganic encapsulating sub-layer CVD1 on a side of the light emitting element LE away from the base substrate BS; the respective high refractive block on a side of the first inorganic encapsulating sub-layer CVD1 away from the light emitting element LE; an organic encapsulating sub-layer IJP on a side of the respective high refractive block away from the base substrate BS; a second inorganic encapsulating sub-layer CVD2 on a side of the organic encapsulating sub-layer IJP away from the base substrate BS; a touch structure TS on a side of the second inorganic encapsulating sub-layer CVD2 away from the base substrate BS; a respective color filter unit CFU on a side of the touch structure TS away from the base substrate BS; and a substantially transparent layer STL on a side of the respective color filter unit CFU away from the base substrate BS. The inventors of the present disclosure discover that a synergistic effect can be achieved by having the respective color filter unit CFU and the respective high refractive block to reduce light luminance loss in the display substrate.

FIG. 17 is a cross-sectional view of a display substrate in some embodiments according to the present disclosure. Referring to FIG. 17, the display substrate in some embodiments includes a plurality of subpixel regions, including a first subpixel region SR1, a second subpixel region SR2, and a third subpixel region SR3. In some embodiments, the color filter layer CFL and the high refractive layer HRL are present in the first subpixel region SR1, and are absent in at least one of the second subpixel region SR2 or the third subpixel region SR3. In some embodiments, the first subpixel region SR1 is a subpixel region of a first color, the second subpixel region SR2 is a subpixel region of a second color, and the third subpixel region SR3 is a subpixel region of a third color. Optionally, the first color, the second color, and the third color are three different colors selected from the group consisting of red, blue, and green. In one example, the first color is a blue color, the second color is a red color, and the third color is a green color.

In an alternative embodiment, the color filter layer CFL and the high refractive layer HRL are present in all of the first subpixel region SR1, the second subpixel region SR2, and the third subpixel region SR3. The plurality of color filter blocks are respectively in a plurality of subpixel regions including subpixel regions of a first color, subpixel regions of a second color, and subpixel regions of a third color.

In some embodiments, a refractive index of the high refractive layer HRL is greater than a refractive index of the first inorganic encapsulating sub-layer CVD1, and is greater than a refractive index of the organic encapsulating sub-layer IJP. Optionally, the refractive index of the first inorganic encapsulating sub-layer CVD1 is greater than the refractive index of the organic encapsulating sub-layer IJP. In one example, the refractive index of the first inorganic encapsulating sub-layer CVD1 is in a range of 1.75 to 1.85. In another example, the refractive index of the organic encapsulating sub-layer IJP is in a range of 1.43 to 1.53.

FIG. 18 is a cross-sectional view of a display substrate in some embodiments according to the present disclosure. Referring to FIG. 18, the light modulating structure in the display substrate in some embodiments includes a high refractive layer HRL and a color filter layer CFL. In some embodiments, the color filter layer CFL includes a plurality of color filter units CFU. A respective color filter unit of the plurality of color filter units CFU is in an individual subpixel. In some embodiments, the high refractive layer HRL includes a plurality of high refractive blocks HRB. A respective high refractive block of the plurality of high refractive blocks HRB is in an individual subpixel.

In some embodiments, the respective high refractive block is on a side of the first inorganic encapsulating sub-layer CVD1 away from the base substrate BS, and on a side of the organic encapsulating sub-layer IJP closer to the base substrate BS. In some embodiments, the respective high refractive block is in direct contact with the first inorganic encapsulating sub-layer CVD1, and in direct contact with the organic encapsulating sub-layer IJP.

In some embodiments, an orthographic projection of the respective color filter unit on the base substrate BS at least partially overlaps with an orthographic projection of the light emitting layer EL on the base substrate BS. In some embodiments, an orthographic projection of the respective high refractive block on the base substrate BS at least partially overlaps with the orthographic projection of the light emitting layer EL on the base substrate BS.

In some embodiments, the color filter layer CFL is on a side of the high refractive layer HRL away from the first inorganic encapsulating sub-layer CVD1, and is on a side of the organic encapsulating sub-layer IJP closer to the first inorganic encapsulating sub-layer CVD1. Optionally, the respective color filter unit CFU is in direct contact with the respective high refractive block, and is in direct contact with the organic encapsulating sub-layer IJP.

Referring to FIG. 18, the display substrate in some embodiments includes a light emitting element LE on the base substrate BS; a first inorganic encapsulating sub-layer CVD1 on a side of the light emitting element LE away from the base substrate BS; a respective high refractive block on a side of the first inorganic encapsulating sub-layer CVD1 away from the light emitting element LE; a respective color filter unit CFU on a side of the respective high refractive block away from the first inorganic encapsulating sub-layer CVD1; an organic encapsulating sub-layer IJP on a side of the respective color filter unit CFU away from the base substrate BS; a second inorganic encapsulating sub-layer CVD2 on a side of the organic encapsulating sub-layer IJP away from the base substrate BS; a touch structure TS on a side of the second inorganic encapsulating sub-layer CVD2 away from the base substrate BS; and a substantially transparent layer STL on a side of the touch structure TS away from the base substrate BS. The inventors of the present disclosure discover that a synergistic effect can be achieved by having the respective color filter unit CFU and the respective high refractive block to reduce light luminance loss in the display substrate.

Various alternative implementations may be practiced in the present disclosure. In one alternative embodiment, the respective color filter unit CFU is on a side of the organic encapsulating sub-layer IJP away from the base substrate BS, and on a side of the second inorganic encapsulating sub-layer CVD2 closer to the organic encapsulating sub-layer IJP. Optionally, the respective color filter unit CFU is in direct contact with the organic encapsulating sub-layer IJP, and in direct contact with the second inorganic encapsulating sub-layer CVD2.

FIG. 19 is a schematic diagram illustrating the structure of a respective high refractive block in some embodiments according to the present disclosure. Referring to FIG. 19, the respective high refractive block is on a side of a first adjacent layer (e.g., a first inorganic encapsulating sub-layer CVD1) away from the base substrate, and on a side of a second adjacent layer (e.g., an organic encapsulating sub-layer IJP) closer to the base substrate. The respective high refractive block is in direct contact with the first adjacent layer and in direct contact with the second adjacent layer. In some embodiments, in a cross-section along a plane perpendicular to the base substrate and intersecting a plurality of subpixels (e.g., the cross-section depicted in FIG. 16, FIG. 18, or FIG. 19), the respective high refractive block has a first side S1", a second side S2" opposite to the first side S1", a third side S3", and a fourth side S4" opposite to the third side S3". The first side S1" is on a side of the second side S2" closer to the base substrate. The first side S1" connects the third side S3" and the fourth side S4".

In some embodiments, a first included angle between the third side S3" and the first side S1" is denoted as $\theta1$", and a second included angle between the fourth side S4" and the first side S1" is denoted as $\theta2$". Optionally, the first included angle $\theta1$" is in a range of 60 degrees to 140 degrees. Optionally, the second included angle $\theta2$" is in a range of 60 degrees to 140 degrees.

The inventors of the present disclosure discover that, surprisingly and unexpectedly, light luminance decay can be significantly reduced when the first included angle $\theta1$" and the second included angle $\theta2$" are in a range of 100 degrees to 140 degrees, e.g., 100 degrees to 110 degrees, 110 degrees to 120 degrees, 120 degrees to 130 degrees, or 130 degrees to 140 degrees. In one example, the first included angle $\theta1$" and the second included angle $\theta2$" are approximately 120 degrees. In some embodiments, in the cross-section along the plane perpendicular to the base substrate and intersecting a plurality of subpixels, the respective color filter block has a hexagonal shape.

FIG. 20 is a cross-sectional view of a display substrate in some embodiments according to the present disclosure. FIG. 21 is a cross-sectional view of a display substrate in some embodiments according to the present disclosure. Referring to FIG. 20 and FIG. 21, the respective color filter unit CFU in some embodiments includes a plurality of color filter blocks CFB.

FIG. 22 is a cross-sectional view of a display substrate in some embodiments according to the present disclosure. FIG. 23 is a cross-sectional view of a display substrate in some embodiments according to the present disclosure. Referring to FIG. 22 and FIG. 23, the light modulating structure in the display substrate in some embodiments includes a lens layer LENL and a color filter layer CFL. In some embodiments, the color filter layer CFL includes a plurality of color filter units CFU. A respective color filter unit of the plurality of color filter units CFU is in an individual subpixel. In some embodiments, the lens layer LENL includes a plurality of lenses LEN. In one example depicted in FIG. 22, the plurality of lenses LEN are a plurality of convex lenses. In one example depicted in FIG. 23, the plurality of lenses LEN are a plurality of concave lenses. The lens layer LENL is on a side of the color filter layer CFL closer to the base substrate BS.

In one example, the lens layer LENL is an independent layer.

In another example, the lens layer LENL and the overcoat layer OC are parts of an unitary structure. The lens layer LENL may be formed by patterning an overcoat material layer.

In some embodiments, the plurality of lenses LEN are in direct contact with the color filter layer CFL. For example, the plurality of lenses LEN in a respective subpixel are in direct contact with the respective color filter unit CFU.

In an alternative embodiment, the plurality of lenses LEN are spaced apart from the color filter layer CFL, e.g., by an insulating layer.

FIG. 24 shows blue light luminance decay with or without a lens layer in some embodiments according to the present disclosure. Referring to FIG. 24, with or without the lens layer, luminance decay increases as the viewing angle increases. The light luminance decay in a display substrate with a lens layer is less than the light luminance decay in a display substrate without the lens layer. Moreover, the light luminance decay in a display substrate with a lens layer having either convex lenses or concave lenses is less than the light luminance decay in a display substrate without the lens layer.

In one example, a respective lens of the plurality of lenses LEN has a diameter in a range of 2 μm to 4 μm. In another example, a distance between adjacent lenses of the plurality of lenses LEN is in a range of 0 μm to 2 μm. In another example, a thickness of the respective lens of the plurality of lenses LEN is in a range of 1 μm to 3 μm.

In some embodiments, the plurality of lenses LEN have a refractive index less than a refractive index of the color filter layer CFL. In one particular example, the refractive index of the plurality of lenses LEN is in a range of 1.45 to 1.55; and the refractive index of the color filter layer CFL is in a range of 1.65 to 1.75. The inventors of the present disclosure discover that, by having light refracted and dispersed by the plurality of lenses LEN, the luminance decay at a relative large viewing angle can be further reduced.

Various alternative implementations may be practiced in the present disclosure. In some embodiments, the light modulating structure includes a color filter layer, a high refractive layer, and a lens layer. FIG. 25 is a cross-sectional view of a display substrate in some embodiments according to the present disclosure. Referring to FIG. 25, the light modulating structure in the display substrate in some embodiments includes a high refractive layer HRL, a color filter layer CFL, and a lens layer LENL. In some embodiments, the color filter layer CFL includes a plurality of color filter units CFU. A respective color filter unit of the plurality of color filter units CFU is in an individual subpixel. In some embodiments, the high refractive layer HRL includes a plurality of high refractive blocks HRB. A respective high refractive block of the plurality of high refractive blocks HRB is in an individual subpixel. In some embodiments, the lens layer LENL includes a plurality of lenses LEN.

In some embodiments, the display substrate is a quantum dots light emitting diode display substrate. Due to the nature of the Lambertian emission of quantum dots, luminance of red subpixels and green subpixels undergoes a relatively small change with respect to viewing angles, whereas luminance of blue subpixels undergoes a relatively large change. The inconsistency in luminance change among subpixels of different colors results in color shift in the related quantum dots light emitting diode display panels.

FIG. 26 is a cross-sectional view of a display substrate in some embodiments according to the present disclosure. FIG. 26 illustrates a cross-section across three adjacent subpixels in the display substrate. FIG. 27 is a cross-sectional view of a display substrate in some embodiments according to the present disclosure. FIG. 27 illustrates a cross-section across one of the three adjacent subpixels depicted in FIG. 26. Referring to FIG. 26 and FIG. 27, the display substrate in some embodiments includes a bank layer BL defining a plurality of apertures, and a color conversion layer CCL comprising a plurality of color conversion blocks CCB at least partially in the plurality of apertures. The bank layer BL and the color conversion layer CCL are on a side of the touch structure TS away from the base substrate BS. For example, the bank layer BL and the color conversion layer CCL are on a side of the overcoat layer OC away from the base substrate BS. The display substrate in some embodiments further includes a second encapsulating layer EN2 on a side of the bank layer BL and the color conversion layer CCL away from the base substrate BS, encapsulating the plurality of color conversion blocks CCB.

The display substrate in some embodiments further includes a light modulating structure LM. In some embodiments, the light modulating structure LM includes a color filter layer CFL on the second encapsulating layer EN2, and a substantially transparent layer STL (e.g., an optically clear adhesive layer) on a side of the color filter layer CFL away from the base substrate BS.

In some embodiments, the color filter layer CFL includes a plurality of color filter units CFU. A respective color filter unit of the plurality of color filter units CFU is in an individual subpixel.

In some embodiments, an orthographic projection of the respective color filter unit on the base substrate BS at least partially overlaps with an orthographic projection of the light emitting layer EL on the base substrate BS.

In some embodiments, the respective color filter unit is configured to filter light emitted from the light emitting layer EL. A first portion of light transmits through the respective color filter unit and out of the display substrate. A second portion of light emitted from the light emitting layer EL transmits out of the display substrate without transmitting through the respective color filter unit. The first portion and the second portion in combination display a subpixel image. The first portion transmits out of the display substrate in a first range of viewing angles. The second portion transmits out of the display substrate in a second range of viewing angles. The second range of viewing angles is greater than the first range of viewing angles.

In some embodiments, at least 5% (e.g., at least 10%, at least 15%, at least 20%, at least 25%, at least 30%, at least 35%, at least 40%, at least 45%, at least 50%, at least 55%, at least 60%, at least 65%, at least 70%, at least 75%, or at least 80%) of light emitted from the light emitting layer EL transmits through the respective color filter unit, forming the first portion.

In some embodiments, no more than 90% (e.g., no more than 85%, no more than 80%, no more than 75%, no more than 70%, no more than 65%, no more than 60%, no more than 55%, no more than 50%, no more than 45%, no more than 40%, no more than 35%, no more than 30%, no more than 25%, no more than 20%, no more than 15%, no more than 10%, or no more than 5%) of light emitted from the light emitting layer EL transmits through the respective color filter unit, forming the first portion.

In some embodiments, at least 5% (e.g., at least 10%, at least 15%, at least 20%, at least 25%, at least 30%, at least 35%, at least 40%, at least 45%, at least 50%, at least 55%, at least 60%, at least 65%, at least 70%, at least 75%, or at least 80%) of light emitted from the light emitting layer EL transmits out of the display substrate without transmitting through the respective color filter unit, forming the second portion.

In some embodiments, no more than 90% (e.g., no more than 85%, no more than 80%, no more than 75%, no more than 70%, no more than 65%, no more than 60%, no more than 55%, no more than 50%, no more than 45%, no more than 40%, no more than 35%, no more than 30%, no more than 25%, no more than 20%, no more than 15%, no more than 10%, or no more than 5%) of light emitted from the light emitting layer EL transmits out of the display substrate without transmitting through the respective color filter unit, forming the second portion.

Referring to FIG. 27, in a cross-section along a plane perpendicular to the base substrate and intersecting a plurality of subpixels (e.g., the cross-section depicted in FIG. 27), the respective color filter unit has a first maximum width mw1. Referring to FIG. 4, in a cross-section along a plane perpendicular to the base substrate and intersecting a plurality of subpixels (e.g., the cross-section depicted in FIG. 27 or FIG. 4), the subpixel aperture SA has an aperture width aw. In some embodiments, the first maximum width mw1 and the aperture width aw are substantially the same. In one example, mw1=aw±0.1 μm.

FIG. 28 shows color shift in display substrates with or without a respective color filter unit in some embodiments according to the present disclosure. Referring to FIG. 28, the color shift is significantly improved in a display substrate having the respective color filter unit as compared to a display substrate that does not have the respective color filter unit.

Referring to FIG. 26, the display substrate in some embodiments includes a plurality of subpixel regions, including a first subpixel region SR1, a second subpixel region SR2, and a third subpixel region SR3. In some embodiments, the color filter layer CFL is present in the first subpixel region SR1, and is absent in at least one of the second subpixel region SR2 or the third subpixel region SR3. In some embodiments, the first subpixel region SR1 is a subpixel region of a first color, the second subpixel region SR2 is a subpixel region of a second color, and the third subpixel region SR3 is a subpixel region of a third color. Optionally, the first color, the second color, and the third color are three different colors selected from the group consisting of red, blue, and green. In one example, the first color is a blue color, the second color is a red color, and the third color is a green color. In one example, the color filter layer CFL is present in subpixel regions in which color conversion blocks are absent.

In an alternative embodiment, the color filter layer CFL is present in all of the first subpixel region SR1, the second subpixel region SR2, and the third subpixel region SR3. The plurality of color filter blocks are respectively in a plurality of subpixel regions including subpixel regions of a first color, subpixel regions of a second color, and subpixel regions of a third color.

FIG. 29 is a schematic diagram illustrating the structure of a respective color conversion block in some embodiments according to the present disclosure. Referring to FIG. 29, the respective color conversion block CCB is a color conversion block configured to convert a light of a first color (e.g., a blue light) into a light of a second color (e.g., a red light or a green light). In some embodiments, the respective color conversion block CCB includes a matrix MS, a plurality of scattering particles SP and a plurality of quantum dots QD dispersed in the matrix MS. The matrix MS may include a polymer material such as an organic polymer material. Examples of appropriate polymer materials for making the matrix MS include epoxy resins, acrylic resins, polyurethane resins, silicone resins, and silane resins. Examples of appropriate materials for making the plurality of scattering particles SP include $TiO_2$, $ZnO$, $ZrO_2$, $Al_2O_3$, $SiO_2$. Examples of appropriate quantum dots materials for making the plurality of quantum dots QD include a quantum dots material of a second color (e.g., a red color or a green color). The quantum dots material may include a material selected from a group consisting of CdS, CdSe, ZnSe, InP, PbS, CsPbCl3, CsPbBr3, CsPhI3, CdS/ZnS, CdSe/ZnS, InP/ZnS, PbS/ZnS, CsPbCl3/ZnS, CsPbBr3/ZnS, and CsPhI3/ZnS.

FIG. 30 is a cross-sectional view of a display substrate in some embodiments according to the present disclosure. FIG. 31 is a cross-sectional view of a display substrate in some embodiments according to the present disclosure. Referring to FIG. 30 and FIG. 31, the light modulating structure in the display substrate in some embodiments includes a high refractive layer HRL and a color filter layer CFL. In some embodiments, the color filter layer CFL includes a plurality of color filter units CFU. A respective color filter unit of the plurality of color filter units CFU is in an individual subpixel. In some embodiments, the high refractive layer HRL includes a plurality of high refractive blocks HRB. A respective high refractive block of the plurality of high refractive blocks HRB is in an individual subpixel.

In some embodiments, the respective high refractive block is on a side of the first inorganic encapsulating sub-layer CVD1 away from the base substrate BS, and on a side of the organic encapsulating sub-layer IJP closer to the base substrate BS. In some embodiments, the respective high refractive block is in direct contact with the first inorganic encapsulating sub-layer CVD1, and in direct contact with the organic encapsulating sub-layer IJP.

In some embodiments, an orthographic projection of the respective color filter unit on the base substrate BS at least partially overlaps with an orthographic projection of the light emitting layer EL on the base substrate BS. In some embodiments, an orthographic projection of the respective high refractive block on the base substrate BS at least partially overlaps with the orthographic projection of the light emitting layer EL on the base substrate BS.

Referring to FIG. 30, the color filter layer CFL is on a side of the touch structure TS away from the base substrate BS.

Referring to FIG. 31, in some embodiments, the color filter layer CFL is on a side of the high refractive layer HRL away from the first inorganic encapsulating sub-layer CVD1, and is on a side of the organic encapsulating sub-layer IJP closer to the first inorganic encapsulating sub-layer CVD1. Optionally, the respective color filter unit CFU is in direct contact with the respective high refractive block, and is in direct contact with the organic encapsulating sub-layer IJP.

FIG. 32 is a cross-sectional view of a display substrate in some embodiments according to the present disclosure. FIG. 33 is a cross-sectional view of a display substrate in some embodiments according to the present disclosure. Referring to FIG. 32 and FIG. 33, the light modulating structure in the display substrate in some embodiments includes a lens layer LENL and a color filter layer CFL. In some embodiments, the color filter layer CFL includes a plurality of color filter units CFU. A respective color filter unit of the plurality of color filter units CFU is in an individual subpixel. In some embodiments, the lens layer LENL includes a plurality of lenses LEN. In one example depicted in FIG. 32, the plurality of lenses LEN are a plurality of convex lenses. In one example depicted in FIG. 33, the plurality of lenses LEN are a plurality of concave lenses. The lens layer LENL is on a side of the color filter layer CFL closer to the base substrate BS.

FIG. 34 is a cross-sectional view of a display substrate in some embodiments according to the present disclosure. Referring to FIG. 34, the light modulating structure in the display substrate in some embodiments includes a high refractive layer HRL, a color filter layer CFL, and a lens layer LENL. In some embodiments, the color filter layer CFL includes a plurality of color filter units CFU. A respective color filter unit of the plurality of color filter units CFU is in an individual subpixel. In some embodiments, the high refractive layer HRL includes a plurality of high refractive blocks HRB. A respective high refractive block of the plurality of high refractive blocks HRB is in an individual subpixel. In some embodiments, the lens layer LENL includes a plurality of lenses LEN.

In some embodiments, the display substrate further includes a first refractive layer and a second refractive layer. The first refractive layer is on a side of the touch structure away from the base substrate. The second refractive layer is on a side of the first refractive layer away from the base substrate. Optionally, the second refractive layer has a refractive index higher than a refractive index of the first refractive layer. By having the first refractive layer and the second refractive layer, light emitted through the touch structure can be converged, enhancing light transmittance rate. The inventors of the present disclosure discover that the presence of the first refractive layer and the second refractive layer results in light luminance decay. The inventors of the present disclosure further discover that the light luminance decay in red subpixels and green subpixels is more severe than the light luminance decay in blue subpixels. Due to different degrees of light luminance decay in subpixels of different colors, color shift is observed in an image displayed by the display substrate.

FIG. 35 is a cross-sectional view of a display substrate in some embodiments according to the present disclosure. FIG. 36 is a cross-sectional view of a display substrate in some embodiments according to the present disclosure. Referring to FIG. 35 and FIG. 36, the display substrate in some embodiments further includes a first refractive layer RL1 and a second refractive layer RL2. The first refractive layer RL1 is on a side of the touch structure TS away from the base substrate BS. The second refractive layer RL2 is on a side of the first refractive layer RL1 away from the base substrate BS. Optionally, the second refractive layer RL2 has a refractive index higher than a refractive index of the first refractive layer RL1.

The display substrate in some embodiments further includes a light modulating structure LM. In some embodiments, the light modulating structure LM includes a color filter layer CFL on the touch structure TS, and a substantially transparent layer STL (e.g., an optically clear adhesive layer) on a side of the color filter layer CFL away from the base substrate BS. In some embodiments, the color filter layer CFL includes a plurality of color filter units CFU. A respective color filter unit of the plurality of color filter units CFU is in an individual subpixel. In some embodiments, an orthographic projection of the respective color filter unit on the base substrate BS at least partially overlaps with an orthographic projection of the light emitting layer EL on the base substrate BS.

In some embodiments, an orthographic projection of the respective color filter unit on the base substrate BS is at least partially non-overlapping with an orthographic projection of the first refractive layer RL1 on the base substrate BS. Optionally, the orthographic projection of the respective color filter unit on the base substrate BS is completely non-overlapping with the orthographic projection of the first refractive layer RL1 on the base substrate BS. By having the color filter layer CFL, the light luminance decay can be significantly reduced.

Referring to FIG. 35, the display substrate in some embodiments includes a plurality of subpixel regions, including a first subpixel region SR1, a second subpixel region SR2, and a third subpixel region SR3. In some embodiments, the color filter layer CFL is present in at least one of the second subpixel region SR2 or the third subpixel region SR3 (e.g., present in both the second subpixel region SR2 and the third subpixel region SR3), and is absent in the first subpixel region SR1. In some embodiments, the first subpixel region SR1 is a subpixel region of a first color, the second subpixel region SR2 is a subpixel region of a second color, and the third subpixel region SR3 is a subpixel region of a third color. Optionally, the first color, the second color, and the third color are three different colors selected from the group consisting of red, blue, and green. In one example, the first color is a blue color, the second color is a red color, and the third color is a green color.

Various alternative implementations may be implemented in the present disclosure. FIG. 37 is a cross-sectional view of a display substrate in some embodiments according to the present disclosure. Referring to FIG. 37, the light modulating structure in the display substrate in some embodiments includes a high refractive layer HRL and a color filter layer CFL. In some embodiments, the color filter layer CFL includes a plurality of color filter units CFU. A respective color filter unit of the plurality of color filter units CFU is in an individual subpixel. In some embodiments, the high refractive layer HRL includes a plurality of high refractive blocks HRB. A respective high refractive block of the plurality of high refractive blocks HRB is in an individual subpixel.

FIG. 38 is a cross-sectional view of a display substrate in some embodiments according to the present disclosure. Referring to FIG. 38, the light modulating structure in the display substrate in some embodiments includes a lens layer LENL and a color filter layer CFL. In some embodiments, the color filter layer CFL includes a plurality of color filter units CFU. A respective color filter unit of the plurality of color filter units CFU is in an individual subpixel. In some embodiments, the lens layer LENL includes a plurality of lenses LEN. The lens layer LENL is on a side of the color filter layer CFL closer to the base substrate BS.

In related display substrates having a black matrix and a color filter, light luminance decay and color shift are also observed. The inventors of the present disclosure further discover that the light modulating structure according to the present disclosure can also be implemented to reduce light luminance decay and color shift. FIG. 39 is a cross-sectional view of a display substrate in some embodiments according to the present disclosure. FIG. 40 is a cross-sectional view of a display substrate in some embodiments according to the present disclosure. Referring to FIG. 39 and FIG. 40, the display substrate in some embodiments includes a black matrix BM and a second color filter layer CFL2 on the touch structure TS, the black matrix BM is in the inter-subpixel region ISR and the second color filter layer CFL2 is at least partially in the subpixel regions (e.g., the first subpixel region SR1, the second subpixel region SR2, and the third subpixel region SR3).

In some embodiments, the display substrate further includes an organic planarization layer OPL on a side of the black matrix BM and the second color filter layer CFL2 away from the base substrate BS. The display substrate in some embodiments further includes a light modulating structure LM. In some embodiments, the light modulating structure LM includes a color filter layer CFL on the organic planarization layer OPL, and a substantially transparent layer STL (e.g., an optically clear adhesive layer) on a side of the color filter layer CFL away from the base substrate BS. In some embodiments, the color filter layer CFL includes a plurality of color filter units CFU. A respective color filter unit of the plurality of color filter units CFU is in an individual subpixel. In some embodiments, an orthographic projection of the respective color filter unit on the base substrate BS at least partially overlaps with an orthographic projection of the light emitting layer EL on the base substrate BS.

In some embodiments, the respective color filter unit is configured to filter light emitted from the light emitting layer EL. A first portion of light transmits through the respective color filter unit and out of the display substrate. A second portion of light emitted from the light emitting layer EL transmits out of the display substrate without transmitting through the respective color filter unit. The first portion and the second portion in combination display a subpixel image. The first portion transmits out of the display substrate in a first range of viewing angles. The second portion transmits out of the display substrate in a second range of viewing angles. The second range of viewing angles is greater than the first range of viewing angles.

In some embodiments, at least 5% (e.g., at least 10%, at least 15%, at least 20%, at least 25%, at least 30%, at least 35%, at least 40%, at least 45%, at least 50%, at least 55%, at least 60%, at least 65%, at least 70%, at least 75%, or at least 80%) of light emitted from the light emitting layer EL transmits through the respective color filter unit, forming the first portion.

In some embodiments, no more than 90% (e.g., no more than 85%, no more than 80%, no more than 75%, no more than 70%, no more than 65%, no more than 60%, no more than 55%, no more than 50%, no more than 45%, no more than 40%, no more than 35%, no more than 30%, no more than 25%, no more than 20%, no more than 15%, no more than 10%, or no more than 5%) of light emitted from the light emitting layer EL transmits through the respective color filter unit, forming the first portion.

In some embodiments, at least 5% (e.g., at least 10%, at least 15%, at least 20%, at least 25%, at least 30%, at least 35%, at least 40%, at least 45%, at least 50%, at least 55%, at least 60%, at least 65%, at least 70%, at least 75%, or at least 80%) of light emitted from the light emitting layer EL transmits out of the display substrate without transmitting through the respective color filter unit, forming the second portion.

In some embodiments, no more than 90% (e.g., no more than 85%, no more than 80%, no more than 75%, no more than 70%, no more than 65%, no more than 60%, no more than 55%, no more than 50%, no more than 45%, no more than 40%, no more than 35%, no more than 30%, no more than 25%, no more than 20%, no more than 15%, no more than 10%, or no more than 5%) of light emitted from the light emitting layer EL transmits out of the display substrate without transmitting through the respective color filter unit, forming the second portion.

Referring to FIG. 40, in a cross-section along a plane perpendicular to the base substrate and intersecting a plurality of subpixels (e.g., the cross-section depicted in FIG. 40), the respective color filter unit has a first maximum width mw1. Referring to FIG. 4, the pixel definition layer PDL defines a subpixel aperture SA. In a cross-section along a plane perpendicular to the base substrate and intersecting a plurality of subpixels (e.g., the cross-section depicted in FIG. 40 or FIG. 4), the subpixel aperture SA has an aperture width aw. In some embodiments, the first maximum width mw1 and the aperture width aw are substantially the same. In one example, mw1=aw±0.1 µm. The inventors of the present disclosure discover that light luminance decay and color shift can be reduced by having the color filter layer CFL.

Referring to FIG. 39, the display substrate in some embodiments includes a plurality of subpixel regions, including a first subpixel region SR1, a second subpixel region SR2, and a third subpixel region SR3. In some embodiments, the color filter layer CFL is present in at least one of the first subpixel region SR1, the second subpixel region SR2, or the third subpixel region SR3. Optionally, the color filter layer CFL is present in all of the first subpixel region SR1, the second subpixel region SR2, and the third subpixel region SR3. In some embodiments, the first subpixel region SR1 is a subpixel region of a first color, the second subpixel region SR2 is a subpixel region of a second color, and the third subpixel region SR3 is a subpixel region of a third color. Optionally, the first color, the second color, and the third color are three different colors selected from the group consisting of red, blue, and green. In one example, the first color is a blue color, the second color is a red color, and the third color is a green color.

Various alternative implementations may be implemented in the present disclosure. FIG. 41 is a cross-sectional view of a display substrate in some embodiments according to the present disclosure. Referring to FIG. 41, the light modulating structure in the display substrate in some embodiments includes a high refractive layer HRL and a color filter layer CFL. In some embodiments, the color filter layer CFL includes a plurality of color filter units CFU. A respective color filter unit of the plurality of color filter units CFU is in an individual subpixel. In some embodiments, the high refractive layer HRL includes a plurality of high refractive blocks HRB. A respective high refractive block of the plurality of high refractive blocks HRB is in an individual subpixel.

FIG. 42 is a cross-sectional view of a display substrate in some embodiments according to the present disclosure.

Referring to FIG. 42, the light modulating structure in the display substrate in some embodiments includes a lens layer LENL and a color filter layer CFL. In some embodiments, the color filter layer CFL includes a plurality of color filter units CFU. A respective color filter unit of the plurality of color filter units CFU is in an individual subpixel. In some embodiments, the lens layer LENL includes a plurality of lenses LEN. The lens layer LENL is on a side of the color filter layer CFL closer to the base substrate BS.

In another aspect, the present disclosure provides a display apparatus including the display substrate described herein or fabricated by a method described herein, and one or more integrated circuits connected to the display substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a mini light emitting diode display apparatus. Optionally, the display apparatus is a quantum dots light emitting diode display apparatus.

In another aspect, the present disclosure provides a method of fabricating a display panel. In some embodiments, the method includes forming a light emitting element on a base substrate; and forming a light modulating structure on a side of the light emitting element away from the base substrate. Optionally, forming the light modulating structure comprises forming a color filter layer and forming a substantially transparent layer on a side of the color filter layer away from the base substrate. Optionally, forming the color filter layer comprises forming a plurality of color filter units, a respective color filter unit of the plurality of color filter units being formed in an individual subpixel. Optionally, adjacent color filter units of the plurality of color filter units are spaced apart by a portion of the substantially transparent layer that extends into a region between the adjacent color filter units. Optionally, an orthographic projection of the respective color filter unit on the base substrate at least partially overlaps with an orthographic projection of a light emitting layer of the light emitting element on the base substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:

a base substrate;

a light emitting element on the base substrate; and a light modulating structure on a side of the light emitting element away from the base substrate;

wherein the light modulating structure comprises a color filter layer and a substantially transparent layer on a side of the color filter layer away from the base substrate;

the color filter layer comprises a plurality of color filter units, a respective color filter unit of the plurality of color filter units being in an individual subpixel; and adjacent color filter units of the plurality of color filter units are spaced apart by a portion of the substantially transparent layer that extends into a region between the adjacent color filter units; and an orthographic projection of the respective color filter unit on the base substrate at least partially overlaps with an orthographic projection of a light emitting layer of the light emitting element on the base substrate;

wherein the light modulating structure further comprises a high refractive layer;

the high refractive layer comprises a plurality of high refractive blocks; and a respective high refractive block of the plurality of high refractive blocks is in the individual subpixel;

wherein the display substrate further comprises an encapsulating layer comprising a first inorganic encapsulating sub-layer and an organic encapsulating sub-layer on a side of the first inorganic encapsulating sub-layer away from the base substrate;

wherein the respective high refractive block is on a side of the first inorganic encapsulating sub-layer away from the base substrate, and on a side of the organic encapsulating sub-layer closer to the base substrate;

the respective high refractive block is in direct contact with the first inorganic encapsulating sub-layer, and in direct contact with the organic encapsulating sub-layer; and an orthographic projection of the respective high refractive block on the base substrate at least partially overlaps with the orthographic projection of the light emitting layer on the base substrate.

2. The display substrate of claim 1, wherein the respective color filter unit is configured to filter light emitted from the light emitting layer;

a first portion of light transmits through the respective color filter unit and out of the display substrate;

a second portion of light emitted from the light emitting layer transmits out of the display substrate without transmitting through the respective color filter unit;

the first portion and the second portion in combination display a subpixel image;

the first portion transmits out of the display substrate in a first range of viewing angles;

26 the second portion transmits out of the display substrate in a second range of viewing angles; and the second range of viewing angles is greater than the first range of viewing angles.

3. The display substrate of claim 2, wherein at least 50% and no more than 95% of light emitted from the light emitting layer transmits through the respective color filter unit, forming the first portion; and at least 5% and no more than 50% of light emitted from the light emitting layer transmits out of the display substrate without transmitting through the respective color filter unit, forming the second portion.

4. The display substrate of claim 1, wherein, in a cross-section along a plane perpendicular to the base substrate and intersecting a plurality of subpixels, the respective color filter unit has a first maximum width;

a subpixel aperture of the individual subpixel has an aperture width; and the first maximum width and the aperture width are substantially the same.

5. The display substrate of claim 1, wherein the respective color filter unit comprises a plurality of color filter blocks spaced apart from each other by a substantially transparent material or by a fill layer comprising light scattering particles dispersed in a matrix.

6. The display substrate of claim 1, wherein, a refractive index of the high refractive layer is greater than a refractive index of the first inorganic encapsulating sub-layer, and is greater than a refractive index of the organic encapsulating sub-layer; and the refractive index of the first inorganic encapsulating sub-layer is greater than the refractive index of the organic encapsulating sub-layer.

7. The display substrate of claim 1, wherein the color filter layer is on a side of the high refractive layer away from the first inorganic encapsulating sub-layer, and is on a side of the organic encapsulating sub-layer closer to the first inorganic encapsulating sub-layer; and the respective color filter unit is in direct contact with the respective high refractive block, and is in direct contact with the organic encapsulating sub-layer.

8. The display substrate of claim 1, wherein the light modulating structure further comprises a lens layer;

the lens layer comprises a plurality of lenses;

the orthographic projection of the respective color filter unit on the base substrate at least partially overlaps with an orthographic projection of the plurality of lenses on the base substrate; and the plurality of lenses have a refractive index less than a refractive index of the color filter layer.

9. The display substrate of claim 1, further comprising a color conversion layer comprising a plurality of color conversion blocks, the color conversion layer comprising a plurality of quantum dots;

wherein the display substrate includes a plurality of subpixel regions, including a first subpixel region, a second subpixel region, and a third subpixel region; and the plurality of color conversion blocks and the color filter layer are absent in the first subpixel region, and are present in at least one of the second subpixel region or a third subpixel region.

10. The display substrate of claim 1, further comprising a first refractive layer and a second refractive layer, the second refractive layer being on a side of the first refractive layer away from the base substrate;

wherein the second refractive layer has a refractive index higher than a refractive index of the first refractive layer; and the orthographic projection of the respective color filter unit on the base substrate is at least partially non-overlapping with an orthographic projection of the first refractive layer.

11. The display substrate of claim 1, further comprising:

a black matrix in an inter-subpixel region;

a second color filter layer at least partially in subpixel regions; and a planarization layer on a side of the black matrix and the second color filter layer away from the base substrate;

wherein the second color filter layer comprises a plurality of second color filter blocks spaced apart by the black matrix;

the color filter layer is on a side of the planarization layer away from the base substrate; and the orthographic projection of the respective color filter unit on the base substrate at least partially overlaps with an orthographic projection of a respective second color filter block of the plurality of second color filter blocks on the base substrate.

12. The display substrate of claim 1, wherein, in a cross-section along a plane perpendicular to the base substrate and intersecting a plurality of subpixels, the respective color filter unit has a first side, a second side opposite to the first side, a third side connecting the first side and the second side, and a fourth side connecting the first side and the second side, the fourth side being opposite to the third side;

the first side has a first width;

the second side has a second width; and the second width is greater than the first width.

13. The display substrate of claim 12, wherein a first included angle between the third side and the first side is in a range of 100 degrees to 140 degrees; and a second included angle between the fourth side and the first side is in a range of 100 degrees to 140 degrees.

14. The display substrate of claim 1, comprising one or more first regions and a second region;

wherein the one or more first regions is a bendable region or a bent region;

the second region is an unbent region; and the light modulating structure is at least partially present in the one or more first region, and is at least partially absent in the second region.

15. The display substrate of claim 1, comprises a plurality of subpixel regions, including a first subpixel region, a second subpixel region, and a third subpixel region; and the color filter layer is present in the first subpixel region, and is absent in at least one of the second subpixel region or the third subpixel region.

16. The display substrate of claim 1, comprises a plurality of subpixel regions, including a first subpixel region, a second subpixel region, and a third subpixel region; and the color filter layer is absent in the first subpixel region, and is present in at least one of the second subpixel region or the third subpixel region.

17. The display substrate of claim 1, comprises a plurality of subpixel regions, including a first subpixel region, a second subpixel region, and a third subpixel region; and the color filter layer is present in all of the first subpixel region, the second subpixel region, and the third subpixel region.

18. A display apparatus, comprising the display substrate of claim 1, and one or more integrated circuits connected to the display substrate.

* * * * *